(12) United States Patent
Ahn et al.

(10) Patent No.: US 12,540,414 B2
(45) Date of Patent: Feb. 3, 2026

(54) ANODIC ALUMINUM OXIDE MOLD, MOLD STRUCTURE INCLUDING SAME, METHOD OF MANUFACTURING MOLDED ARTICLE USING ANODIC ALUMINUM OXIDE MOLD, AND MOLDED ARTICLE MANUFACTURED THEREBY

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 704 days.

(21) Appl. No.: 17/403,689

(22) Filed: Aug. 16, 2021

(65) Prior Publication Data
US 2022/0056606 A1    Feb. 24, 2022

(30) Foreign Application Priority Data
Aug. 19, 2020  (KR) .......... 10-2020-0103897

(51) Int. Cl.
| | | |
|---|---|---|
| C25D 1/00 | (2006.01) | |
| C25D 11/04 | (2006.01) | |
| G01R 1/073 | (2006.01) | |

(52) U.S. Cl.
CPC ............. *C25D 1/00* (2013.01); *C25D 11/04* (2013.01); *G01R 1/07342* (2013.01)

(58) Field of Classification Search
None
See application file for complete search history.

(56) References Cited

U.S. PATENT DOCUMENTS

| | | | | |
|---|---|---|---|---|
| 4,681,666 A | * | 7/1987 | Potter | ................. H01L 21/7684 |
| | | | | 257/E21.291 |
| 2006/0166479 A1 | * | 7/2006 | Seo | ..................... H01R 12/714 |
| | | | | 438/618 |
| 2008/0143368 A1 | * | 6/2008 | Hayashizaki | ........... G01R 3/00 |
| | | | | 216/18 |
| 2009/0297913 A1 | * | 12/2009 | Zhang | ................... H01M 4/921 |
| | | | | 204/403.01 |

(Continued)

FOREIGN PATENT DOCUMENTS

| | | |
|---|---|---|
| JP | 2005-512063 A | 4/2005 |
| JP | 2006-514289 A | 4/2006 |
| JP | 2006-326723 A | 12/2006 |

(Continued)

OTHER PUBLICATIONS

Yildirim, D. (2016). An Investigation of Anodic Aluminum Oxide for Electronic and MEMS Applications (Doctoral dissertation, UC Irvine (Year: 2016).*

(Continued)

*Primary Examiner* — Louis J Rufo

(57) ABSTRACT

Proposed are an anodic aluminum oxide mold capable of manufacturing a molded article having at least a portion with a dimensional range of several tens of μm, and a mold structure including the same. Additionally, proposed are a method of manufacturing a molded article with a dimensional range of several tens of μm using the anodic aluminum oxide mold, and a molded article manufactured thereby.

6 Claims, 22 Drawing Sheets

(56) References Cited

U.S. PATENT DOCUMENTS

2016/0115610 A1* 4/2016 Hemmi .................. C25D 1/20
205/78

FOREIGN PATENT DOCUMENTS

| JP | 2008-151515 A | | 7/2008 |
|---|---|---|---|
| JP | 2008-191027 A | | 8/2008 |
| JP | 5786906 B2 | | 9/2015 |
| JP | 2016057268 A | * | 4/2016 |
| KR | 1020180004753 A | | 1/2018 |
| TW | 200944801 A | | 11/2009 |
| TW | 201024743 A1 | | 7/2010 |
| TW | I363876 B | | 5/2012 |
| TW | 201504633 A | | 2/2015 |
| WO | WO-2021171808 A1 * | 9/2021 | ............... C25D 1/00 |

OTHER PUBLICATIONS

Office Action for Taiwanese Patent Application No. 112116746, dated Aug. 22, 2023.

* cited by examiner

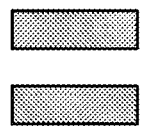
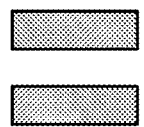
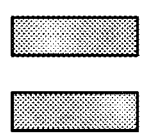
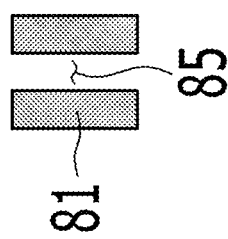
Fig. 7B

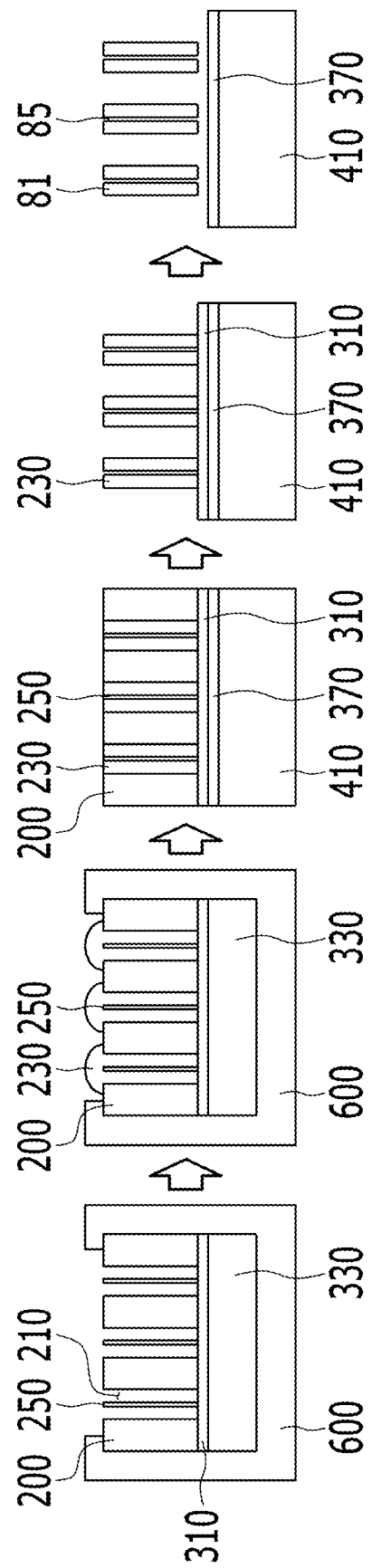

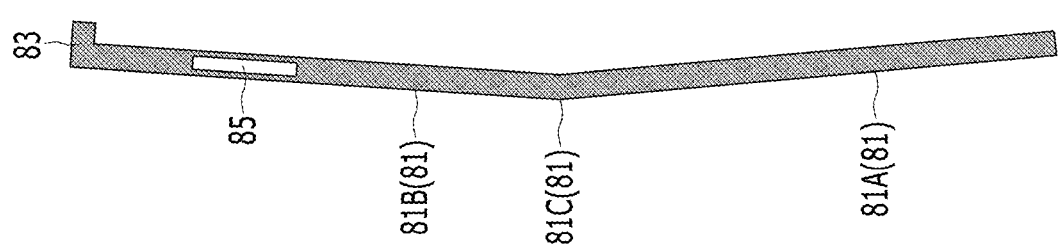
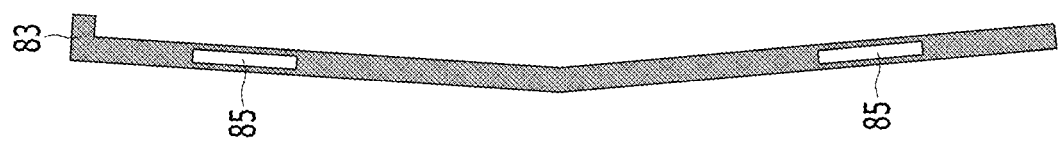
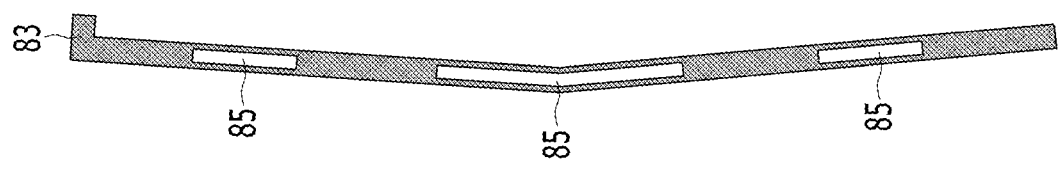
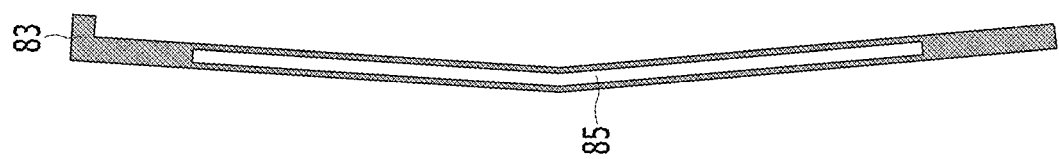

ANODIC ALUMINUM OXIDE MOLD, MOLD STRUCTURE INCLUDING SAME, METHOD OF MANUFACTURING MOLDED ARTICLE USING ANODIC ALUMINUM OXIDE MOLD, AND MOLDED ARTICLE MANUFACTURED THEREBY

CROSS REFERENCE TO RELATED APPLICATION

The present application claims priority to Korean Patent Application No. 10-2020-0103897, filed on Aug. 19, 2020, the entire contents of which is incorporated herein for all purposes by this reference.

BACKGROUND OF THE INVENTION

Field of the Invention

The present disclosure relates to an anodic aluminum oxide mold, a mold structure including the same, a method of manufacturing a molded article using the anodic aluminum oxide mold, and a molded article manufactured thereby.

Description of the Related Art

The present disclosure relates to an anodic aluminum oxide mold capable of manufacturing a molded article having at least a portion with a dimensional range of several tens of µm, and to a mold structure including the same. Additionally, the present disclosure relates to a method of manufacturing a molded article with a dimensional range of several tens of µm using the anodic aluminum oxide mold, and to a molded article manufactured thereby. Hereinafter, a probe pin of a probe card will be described as an example of the above molded article.

A test for electrical characteristics of semiconductor devices is performed by approaching a semiconductor wafer to a probe card having a plurality of probe pins, thereby bringing the respective probe pins into contact with corresponding electrode pads on the semiconductor wafer. When bringing the probe pins into contact with the corresponding electrode pads on the semiconductor wafer, after the probe pins and the corresponding electrode pads reach a state in which they start to make contact with each other, a process of further approaching the semiconductor wafer to the probe card is performed. This process is called overdrive. The overdrive is a process to elastically deform the probe pins. By performing the overdrive, all the probe pins can be reliably brought into contact with the corresponding electrode pads even in the case where there are variations in height among the electrode pads or the probe pins. In addition, during the overdrive, as the probe pins are elastically deformed, probe tips scrub across the electrode pads. This scrubbing action causes the tips to remove oxide layers on the surface of the electrode pads, which reduces contact resistance.

Recently, the development of a probe card capable of transmitting a signal having a frequency greater than 1 GHz has been demanded. Here, if the length of a probe pin that transmits signals having a frequency greater than 1 GHz is shortened to equal to or less than 10 mm, it is possible to reduce the inductance thereof and to improve high frequency characteristics of a test signal. However, if it is attempted to ensure a sufficient overdrive amount while shortening the length of the probe pin to equal to or less than 10 mm, there is a problem in that the probe pin is plastically deformed during overdrive. There is also a problem of causing breakage, which is permanent damage to an electrode pad.

On the other hand, it may be considered to suppress stress during overdrive by reducing the thickness of the probe pin. However, the problem of this approach is that as the thickness of the probe pin is reduced, the cross-sectional area thereof is also reduced, which lowers probe pressure during overdrive and deteriorates permissible time-current characteristics.

Therefore, it is necessary to develop a probe pin capable of ensuring an overdrive amount, probe pressure, and high frequency characteristics, and to develop a manufacturing technology capable of producing such a probe pin more effectively.

In the manufacture of probe pins, a method of manufacturing a probe pin by means of laser technology is typically used. For example, the probe pin may be formed by cutting a substrate made of a conductive material with a laser beam. The laser beam can cut the substrate along a predetermined profile conforming to the probe pin and form a sharp edge on the probe pin through different operations. However, this laser cutting technology, which manufactures a probe pin by cutting a metal sheet along a profile conforming to the final shape of the probe pin, is problematic in that there is a limitation in improving the dimensional accuracy of the probe pin, and there is also a limitation in the shape that can be formed.

The foregoing is intended merely to aid in the understanding of the background of the present disclosure, and is not intended to mean that the present disclosure falls within the purview of the related art that is already known to those skilled in the art.

Documents of Related Art
  (Patent document 1) Korean Patent Application Publication No. 10-2018-0004753

SUMMARY OF THE INVENTION

Accordingly, the present disclosure has been made keeping in mind the above problems occurring in the related art, and an objective of the present disclosure is to provide an anodic aluminum oxide mold capable of precisely and reliably manufacturing a molded article having at least a portion with a dimensional range of several tens of µm, to provide a mold structure including the same, to provide a method of manufacturing a molded article using the anodic aluminum oxide mold, and to provide a molded article manufactured thereby.

Another objective of the present disclosure is to provide an anodic aluminum oxide mold capable of manufacturing, when a molded article is a probe pin, the probe pin capable of ensuring an overdrive amount, probe pressure, and high frequency characteristics, to provide a mold structure including the same, to provide a method of manufacturing a molded article using the anodic aluminum oxide mold, and to provide a molded article manufactured thereby.

In order to achieve the above objectives, according to one aspect of the present disclosure, there is provided an anodic aluminum oxide mold made of an anodic aluminum oxide film and provided with an opening.

Furthermore, the anodic aluminum oxide mold may include an island provided in the opening and made of an anodic aluminum oxide film.

Furthermore, a metal filler may be provided in the opening to become a probe pin.

According to another aspect of the present disclosure, there is provided a mold structure including: an anodic aluminum oxide mold made of an anodic aluminum oxide film and provided with an opening; and a support member provided under the anodic aluminum oxide mold.

Furthermore, the mold structure may further include: a metal layer provided between the anodic aluminum oxide mold and the support member.

Furthermore, the metal layer may be exposed through the opening.

Furthermore, the metal layer may serve as a plating seed layer for a metal filler formed in the opening.

According to still another aspect of the present disclosure, there is provided a method of manufacturing a molded article, the method including: providing an anodic aluminum oxide mold made of an anodic aluminum oxide film and provided with an opening; forming a metal filler in the opening; and removing the anodic aluminum oxide mold.

Furthermore, the forming of the metal filler in the opening may include performing plating while a metal layer provided under the anodic aluminum oxide mold and exposed through the opening serves as a seed layer.

Furthermore, the molded article may be a probe pin.

According to still another aspect of the present disclosure, there is provided a molded article including: a body; and a void formed in the body, in which the void may have a width in the range of from 1 µm to 100 µm.

Furthermore, the molded article may be a probe pin.

According to the anodic aluminum oxide mold, the mold structure including the same, the method of manufacturing a molded article using the anodic aluminum oxide mold, and the molded article manufactured thereby according to the present disclosure, it is possible to provide an anodic aluminum oxide mold capable of precisely and reliably manufacturing a molded article having at least a portion with a dimensional range of several tens of µm.

Furthermore, according to the present disclosure, it is possible to provide an anodic aluminum oxide mold capable of manufacturing, when a molded article is a probe pin, the probe pin capable of ensuring an overdrive amount, probe pressure, and high frequency characteristics.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 4A is a plan view illustrating a mold structure according to an exemplary embodiment of the present disclosure;

FIG. 7B is a sectional view taken along line A-A' of FIG. 7A;

FIGS. 8A to 8E are views schematically illustrating a method of manufacturing a molded article according to an exemplary embodiment of the present disclosure;

FIGS. 10A to 12D are views illustrating various modifications of the probe pin according to the exemplary embodiment of the present disclosure.

DETAILED DESCRIPTION OF THE INVENTION

Figure 1:
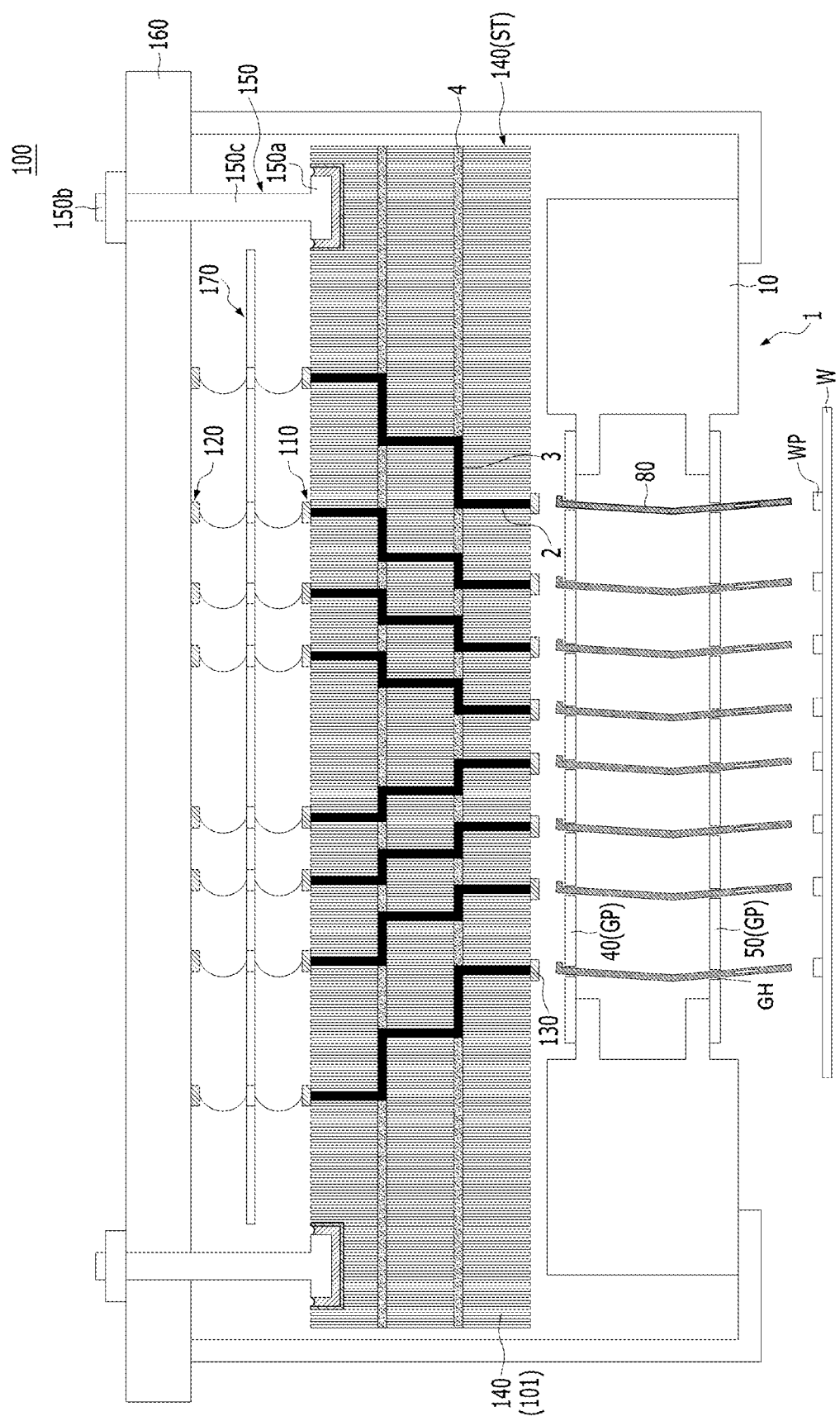
FIG. 1 is a view schematically illustrating a probe card according to an exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the disclosure even though it is not clearly explained or illustrated in the description. Furthermore, in principle, all the conditional terms and embodiments listed in this description are clearly intended for the purpose of understanding the concept of the present disclosure, and one should understand that this disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses and widths of films and regions in the figures may be exaggerated. Therefore, variations from the shapes of the illustrations as a result, for example, of manufacturing techniques and/or tolerances, are to be expected. In addition, a limited number of holes are illustrated in the drawings.

Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

FIG. 1 is a view schematically illustrating a probe card 100 according to an exemplary embodiment of the present disclosure. In this figure, for convenience of description, the number and size of a plurality of probe pins 80 are illustrated exaggeratedly.

Depending on the structure of installing the probe pins 80 on a connection member 140 (ST) and the structure of the probe pins 80, the types of the probe card 100 may be classified into a vertical type probe card, a cantilever type probe card, a micro-electro-mechanical system (MEMS) probe card. In the present disclosure, a vertical type probe card 100 is illustrated as an example to describe a coupling structure between the connection member 140 (ST) and other peripheral parts. The type of probe card in which the coupling structure between the connection member 140 (ST) and other peripheral parts is implemented is not limited thereto, and may be the MEMS probe card and the cantilever type probe card.

A test for electrical characteristics of semiconductor devices is performed by approaching a semiconductor wafer W to the probe card 100 having the plurality of probe pins 80, thereby bringing the respective probe pins 80 into contact with corresponding electrode pads WP on the semiconductor wafer W. After the probe pins 80 reach a position where they make contact with the electrode pads WP, the semiconductor wafer W is further lifted by a predetermined height toward the probe card 100. This process is called overdrive.

As illustrated in FIG. 1, the probe card 100 according to the present disclosure may include the connection member 140 (ST) and a coupling member 150. In this case, the coupling member 150 may be configured as a bolt, but is not limited thereto.

The connection member 140 may be configured as a space transformer ST. A circuit board 160 may be provided above the space transformer 140 (ST), and a probe head 1 on which the plurality of probe pins 80 are provided may be provided below the space transformer 140 (ST). In other words, the space transformer 140 (ST) may be located between the circuit board 160 and the probe head 1. The space transformer 140 (ST) may be coupled to peripheral parts by the coupling member 150.

The space transformer 140 (ST) coupled to the circuit board 160 by the coupling member 150 may be electrically connected thereto by a connector 170 interposed between the circuit board 160 and the space transformer 140 (ST). Specifically, first connector connection pads 110 may be provided on an upper surface of the space transformer 140 (ST), and second connector connection pads 120 may be provided on a lower surface of the circuit board 160. Therefore, the connector 170 interposed between the space transformer 140 (ST) and the circuit board 160 may be joined to the first connector connection pads 110 and the second connector connection pads 120 to form an electrical connection between the space transformer 140 (ST) and the circuit board 160.

An insulating part 141 of the space transformer 140 (ST) may be made of an anodic aluminum oxide film 101. The anodic aluminum oxide film 101 refers to a film formed by anodizing a metal that is a base material, and pores 101a refer to pores formed in the anodic aluminum oxide film 101 during the process of forming the anodic aluminum oxide film 101 by anodizing the metal. For example, in the case where the metal as the base material is aluminum (Al) or an aluminum alloy, the anodization of the base material forms the anodic aluminum oxide film 101 consisting of anodic aluminum oxide ($Al_2O_3$) on a surface of the base material. The anodic aluminum oxide film 101 has a coefficient of thermal expansion of 2 to 3 ppm/° C. This is advantageous in that the amount of deformation due to temperature is small. In addition, the coefficient of thermal expansion of the anodic aluminum oxide film 101 is close to that of the semiconductor wafer W as an object to be tested, so that positional misalignment between the probe pins 80 and the electrode pads WP may be minimized even under a high-temperature environment.

According to the present disclosure, by configuring the space transformer 140 (ST) using the anodic aluminum oxide film 101, the space transformer 140 (ST) having a small amount of thermal deformation under a high-temperature environment may be implemented. However, the material of the space transformer 140 (ST) is not limited to the anodic aluminum oxide film 101, and may be a ceramic material, a polyimide material, or another suitable dielectric material.

The space transformer 140 (ST) may have a structure in which a plurality of layers are stacked. Specifically, vertical wiring parts 2 may be provided in each of the layers of the space transformer 140 and ST, and vertical wiring parts 2 of an upper layer thereof and vertical wiring parts 2 of a lower layer thereof may be electrically connected to each other through horizontal wiring parts 3. In this case, the interval between vertical wiring parts 2 of an uppermost layer of the space transformer 140 (ST) may be the same as that between the second connector connection pads 120 of the circuit board 160, and the interval between the respective vertical wiring parts 2 of the plurality of layers thereof may become gradually narrow from the uppermost layer toward the lower layer. In addition, the interval between vertical wiring parts 2 of a lowermost layer of the space transformer 140 (ST) may be the same as that between probe connection pads 130 provided under the space transformer 140 (ST). Therefore, the interval between the probe connection pads 130 provided under the space transformer 140 (ST) may be narrower than that between the second connector connection pads 120 of the circuit board 160. In other words, by providing the space transformer 140 (ST) between the circuit board 160 and the probe head 1, the plurality of probe pins 80 may be arranged at a narrower interval. This means that it is possible to implement a fine pitch of the probe pins 80 through the space transformer 140 (ST).

The probe head 1 is provided below the space transformer 140 (ST). The probe head 1 supports the probe pins 80 and includes a plurality of guide plates GP each having a plurality of guide holes GH.

The probe head 1 may have a structure in which an upper guide plate 40 and a lower guide plate 50 are sequentially provided. In this case, at least one of the upper guide plate 40 and the lower guide plate 50 may be made of an anodic aluminum oxide film. However, the material of the upper guide plate 40 and/or the lower guide plate 50 is not limited to the anodic aluminum oxide film, and may be a ceramic material, a polyimide material, or another suitable dielectric material. However, when the upper guide plate 40 and/or the lower guide plate 50 are made of the anodic aluminum oxide film, there is an advantage in that the amount of deformation due to temperature is small. In addition, the coefficient of thermal expansion of the anodic aluminum oxide film is close to that of the semiconductor wafer W as an object to be tested, so that positional misalignment between the probe pins 80 and the electrode pads WP may be minimized even under a high-temperature environment.

The upper guide plate 40 and the lower guide plate 50 may be supported by a spacer 10. The spacer 10 may have a central space for allowing the probe pin 80 to pass therethrough. Specifically, the upper guide plate 40 may be provided in an upper seating region 15 formed on an upper surface of the spacer 10, and the lower guide plate 50 may be provided in a lower seating region 25 formed on a lower surface of the spacer 10. In this case, the upper seating region 15 may be configured as a concave recess in the upper surface of the spacer 10, and the lower seating region 25 may be configured as a concave recess in the lower surface of the spacer 10. However, since the concave recess shape of the upper seating region 15 and the lower seating region 25 is illustrated as an example, the shape thereof is not limited thereto. Therefore, the upper seating region 15 and the lower seating region 25 may be formed in a suitable shape to allow the upper guide plate 40 and the lower guide plate 50 to be provided on the upper and lower surfaces of the spacer 10 more stably.

A test for electrical characteristics of semiconductor devices is performed by approaching the semiconductor wafer W to the probe card 100 having the plurality of probe pins 80, thereby bringing the respective probe pins 80 into contact with corresponding electrode pads WP on the semiconductor wafer W. When bringing the probe pins 80 into contact with the corresponding electrode pads WP on the semiconductor wafer W, after the probe pins 80 and the corresponding electrode pads WP reach a state in which they start to make contact with each other, a process of further approaching the semiconductor wafer W to the probe card 100 is performed. The probe pins 80 are configured to elastically deform between the upper guide plate 40 and the lower guide plate 50. These probe pin 80 are adopted to constitute the vertical type probe card 100. As an exemplary embodiment of the present disclosure, the probe pins are described as having a pre-deformed structure, i.e., being in the form of cobra pins, but are not limited thereto. As another exemplary embodiment of the present disclosure, the probe pins 80 may be in the form of straight pins that are deformed by a moving plate.

Figure 2A:
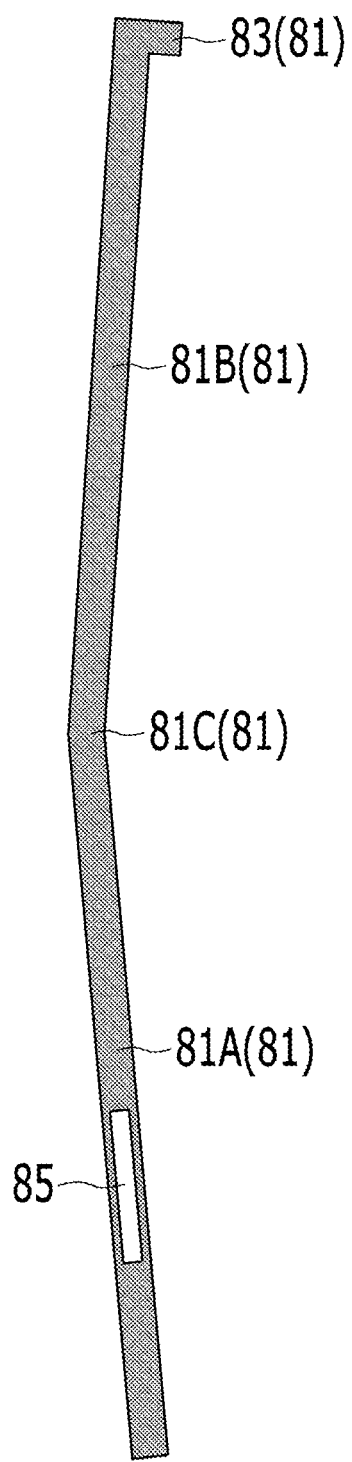
FIG. 2A is a front view illustrating a probe pin according to an exemplary embodiment of the present disclosure.
Figure 2B:
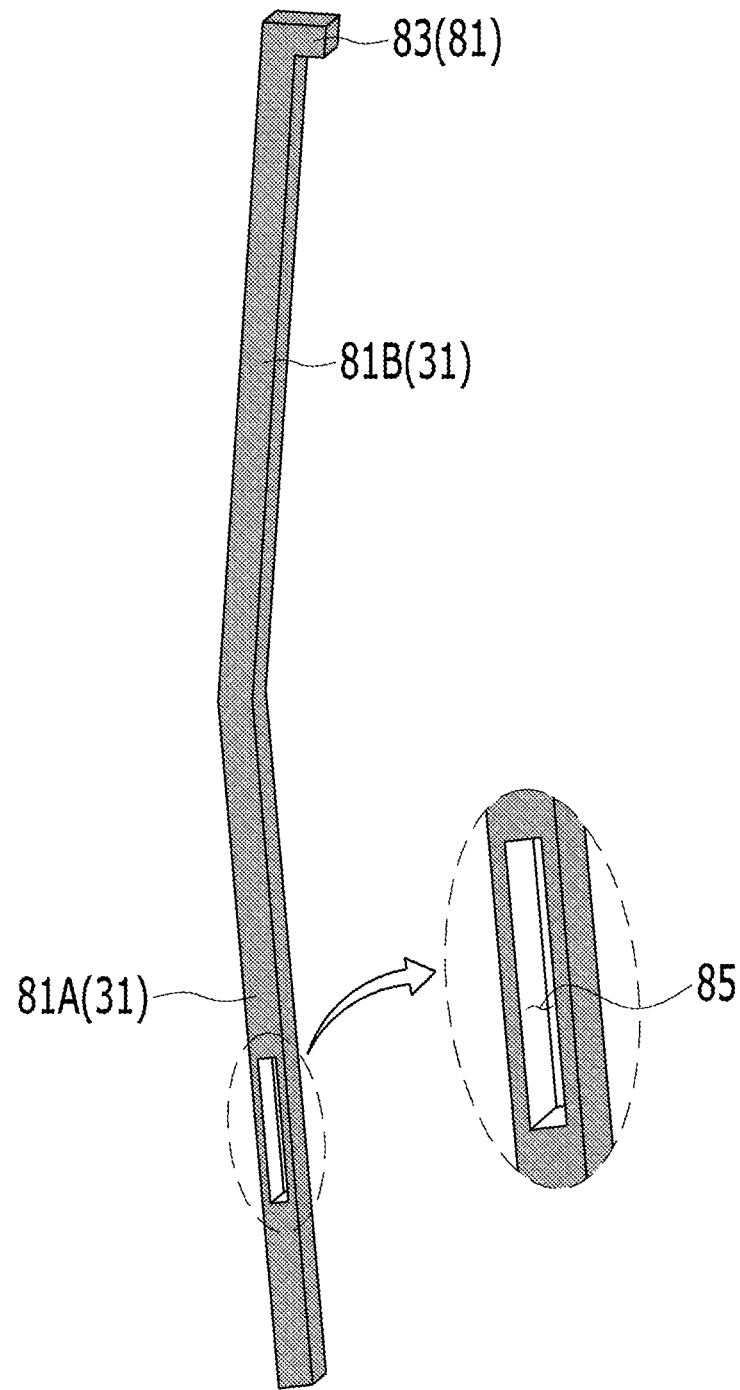
FIG. 2B is a perspective view illustrating the probe pin according to the exemplary embodiment of the present disclosure.

As illustrated in FIGS. 2A and 2B, each of the probe pins 80 includes a body 81 and a void 85 formed in the body 81. The width of the body 81 may be in the range of from 1 μm to 100 μm, including the width of the void 85. In addition, the width of the void 85 may be in the range of from 1 μm to 100 μm. Specifically, the width of the void 85 may be several tens of μm, for example, in the range of from 10 μm to 50 μm. The total length of the probe pin 80 may be in the range of from 1 mm to 10 mm.

The body 81 includes a first body 81A and a second body 81B. The second body 81B is formed continuously with the first body 81A, and the longitudinal central axis of the second body 81B forms an obtuse angle with the longitudinal central axis of the first body 81A. The body 81 has a bent portion formed at an intersection 81C of the first body 81A and the second body 81B. Referring to FIGS. 2A and 2B, the void 85 is formed in the first body 81A. The specific configuration of the void 85 will be described later. The first body 81A may have a pointed-shaped lower end. The pointed end shape may ensure reliable scrubbing of the probe pin 80.

Figure 2C:
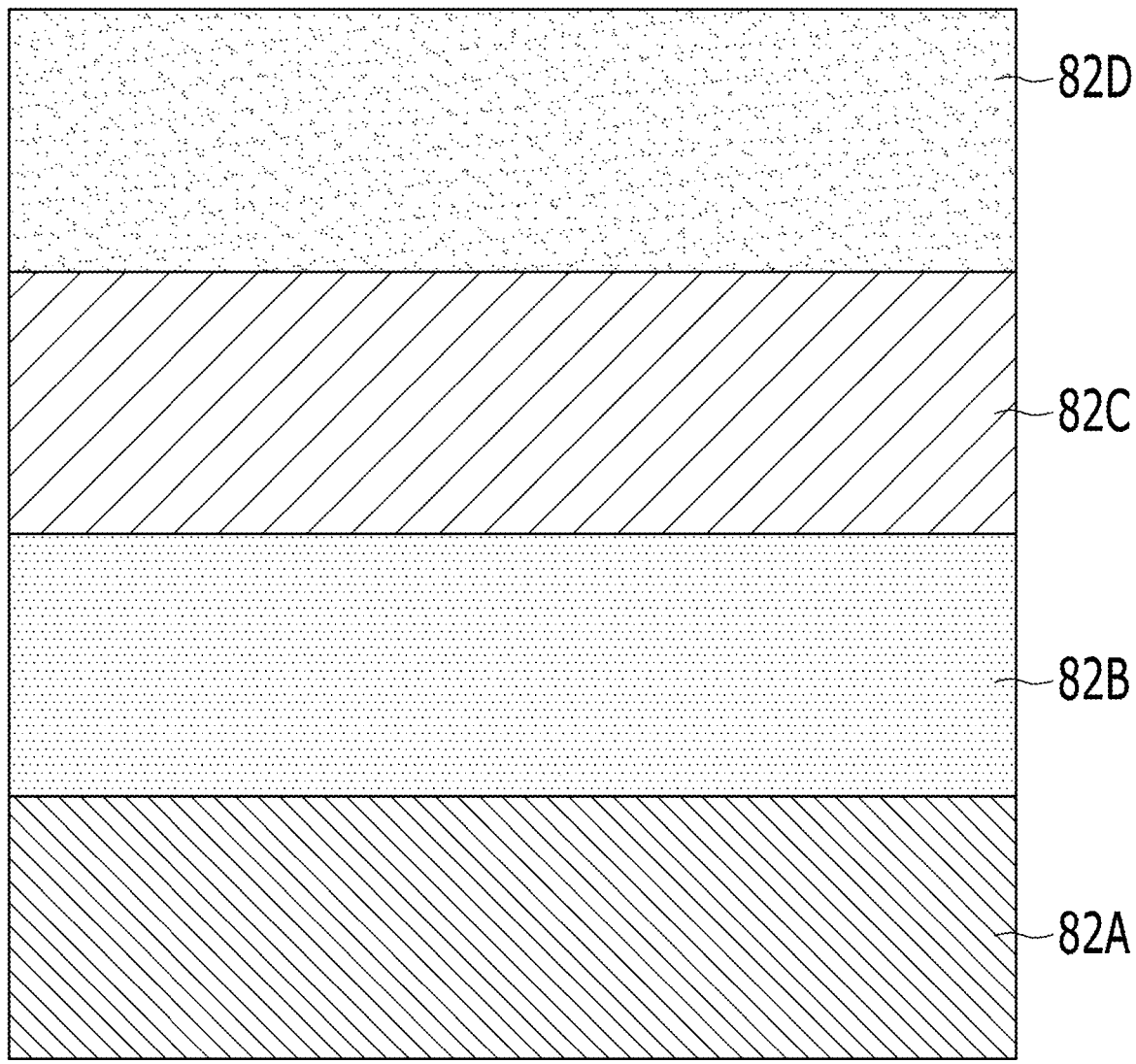
FIG. 2C is a sectional view illustrating the probe pin according to the exemplary embodiment of the present disclosure.
Figure 2D:
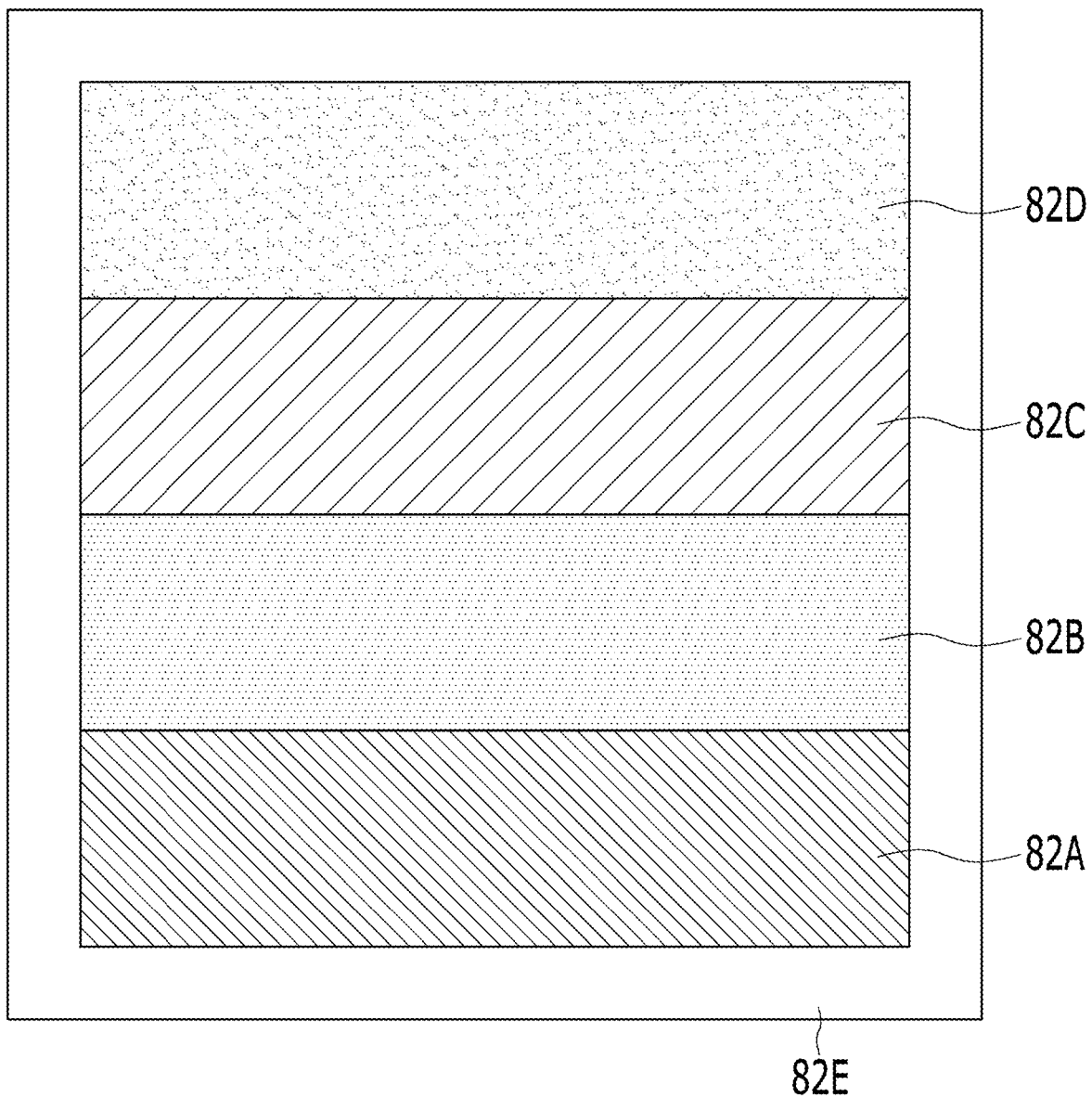
FIG. 2D is a sectional view illustrating the probe pin according to the exemplary embodiment of the present disclosure.

FIGS. 2C and 2D are views each illustrating a cross-section of the probe pin 80. The body 81 may have a quadrangular cross-section. In this case, the respective guide holes GH of the upper guide plate 40 and the lower guide plate 50 may have a quadrangular cross-section to conform to the cross-sectional shape of the body 81. With the configuration in which the body 81 has a quadrangular cross-section and the guide holes GH have a quadrangular cross-section, it is possible to prevent the probe pin 80 from rotating in the guide holes GH, thereby preventing interference between the probe pins 80. This enables the implementation of fine pitches.

The body 81 of the probe pin 80 may be made of a conductive material. Here, the conductive material may be at least one selected from the group consisting of platinum (Pt), rhodium (Ph), palladium (Pd), copper (Cu), silver (Ag), gold (Au), iridium (Ir), an alloy thereof, a nickel-cobalt (NiCo) alloy, a palladium-cobalt (PdCo) alloy, a palladium-nickel (PdNi) alloy, and a nickel-phosphorus (NiP) alloy. Referring to FIG. 2C, the body 81 of the probe pin 80 may have a multi-layer structure in which a plurality of layers of conductive materials are stacked. Each of the conductive layers may be made of a different material. The material thereof may be selected from the group consisting of platinum (Pt), rhodium (Ph), palladium (Pd), copper (Cu), silver (Ag), gold (Au), iridium (Ir), an alloy thereof, a palladium-cobalt (PdCo) alloy, a palladium-nickel (PdNi) alloy, and a nickel-phosphorus (NiP) alloy. As an embodiment, the body 81 of the probe pin 80 may have a multi-layer structure in which first to fourth conductive layers are stacked. Here, the first conductive layer 82A may be made of platinum (Pt), the second conductive layer 82B may be made of rhodium (Ph), the third conductive layer 82C may be made of palladium (Pd), and the fourth conductive layer 82D may be made of a nickel-cobalt (NiCo) alloy.

Referring to FIG. 2D, the body 81 of the probe pin 80 may further include an outer coating layer 82E. The outer coating layer 82E may be made of a material having a hardness higher than that of the conductive materials located inside thereof. As an embodiment, the material of the outer coating layer 82E may be at least one selected from the group consisting of rhodium (Rd), platinum (Pt), iridium (Ir), an alloy thereof, a nickel-cobalt (NiCo) alloy, a palladium-cobalt (PdCo) alloy, a palladium-nickel alloy (PdNi) alloy, and a nickel-phosphorus (NiP) alloy.

A method of manufacturing a molded article according to an exemplary embodiment of the present disclosure includes: providing an anodic aluminum oxide mold 200 made of an anodic aluminum oxide film and provided with openings 210; forming a metal filler 230 in each of the openings 210; and removing the anodic aluminum oxide mold 200 using an etchant.

Hereinafter, an anodic aluminum oxide mold 200 according to an exemplary embodiment of the present disclosure capable of manufacturing a molded article, for example, a probe pin 80, and the method of manufacturing the molded article using the anodic aluminum oxide mold 200 will be described with reference to FIGS. 3A to 3C.

The anodic aluminum oxide mold 200 which will be described below refers not only to one after openings 210 are formed, but also to one before the openings 210 are formed.

The anodic aluminum oxide mold 200 is made of an anodic aluminum oxide film, and provided with openings 210. In addition, the anodic aluminum oxide mold 200 includes an island 250 provided in each of the openings and made of an anodic aluminum oxide film. The anodic aluminum oxide mold 200 is a mold in which the metal filler 230 is formed in each of the openings 210 to become the probe pin 80.

Figure 3A:
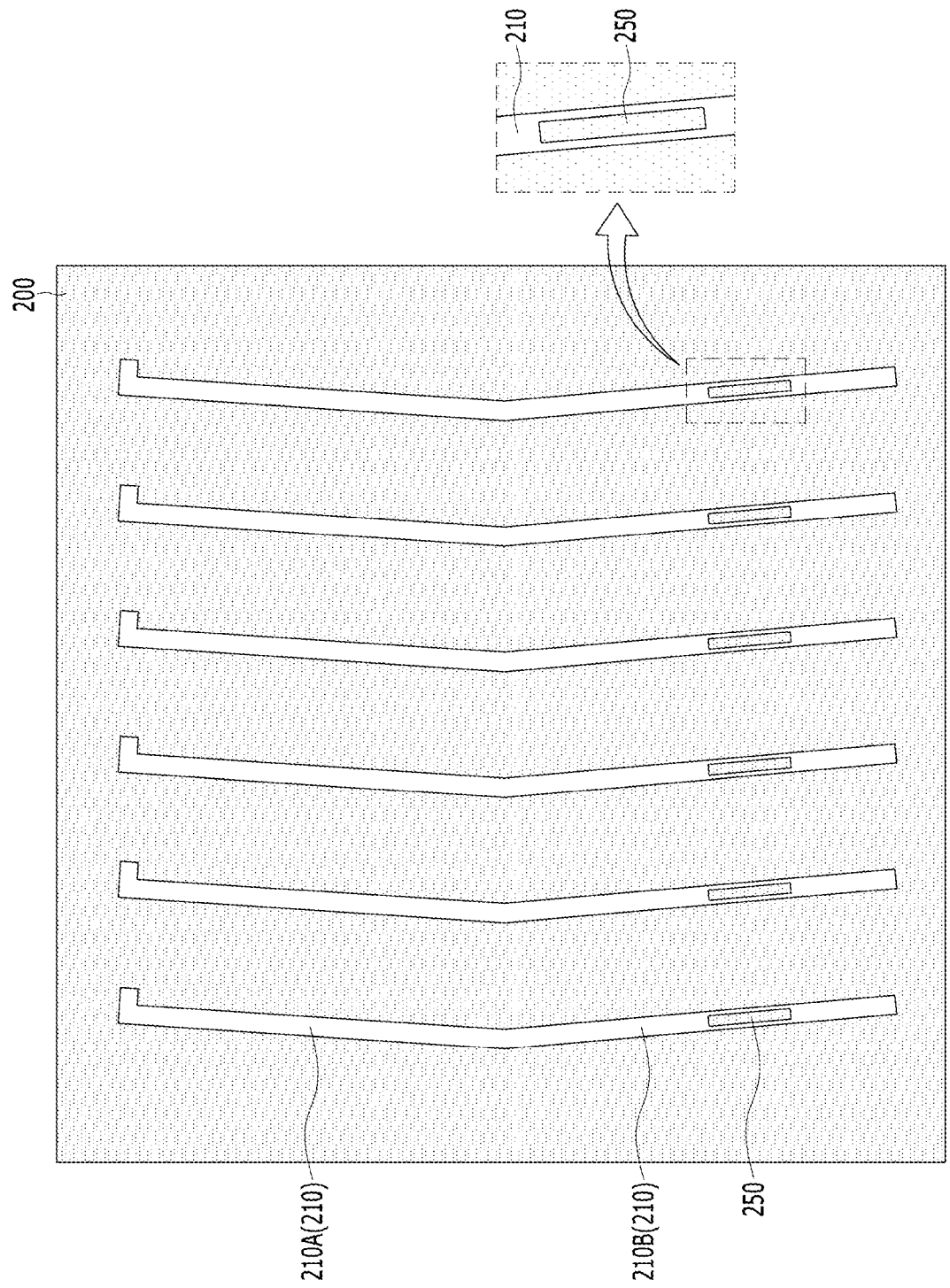
FIG. 3A is a plan view illustrating an anodic aluminum oxide mold with openings according to an exemplary embodiment of the present disclosure.

Referring to FIG. 3A, the anodic aluminum oxide mold 200 is made of the anodic aluminum oxide film and provided with the openings 210. The anodic aluminum oxide mold 200 is formed by anodizing a metal base material. The island 250 made of the anodic aluminum oxide film is provided inside each of the openings 210. The island 250 is a region defined by a remaining portion of the anodic aluminum oxide mold 200 remaining without being removed when each of the openings 210 is formed by etching a portion of the anodic aluminum oxide mold 200, and is an anodic aluminum oxide film region surrounded by the opening 210. The anodic aluminum oxide mold 200 may have a thickness in the range of from 50 μm to 100 μm.

The openings 210 may be formed by etching the anodic aluminum oxide mold 200. For example, a photoresist may be provided on an upper surface of the anodic aluminum oxide mold 200 and patterned. Then, in patterned and opened regions, the anodic aluminum oxide film may react with the etchant to form the openings 210. Specifically, a photosensitive material may be provided on the upper surface of the anodic aluminum oxide mold 200 before the openings 210 are formed, followed by undergoing an exposure process. At least portions of the photosensitive material may be patterned and removed through the exposure process. Here, the photosensitive material is not removed but remains on portions of the anodic aluminum oxide mold 200 that will later become islands 250. The anodic aluminum oxide mold 200 is etched in open regions from which the photosensitive material has been patterned and removed. The anodic aluminum oxide film is removed by the etchant in the open regions except for regions that will later become the islands 250, resulting in the openings 210.

The shape of the openings 210 and the islands 250 may be determined according to the shape of patterns resulting from patterning of the photosensitive material provided on the upper surface of the anodic aluminum oxide mold 200. The photosensitive material is not limited in the dimension and shape of regions to be patterned. Since the openings 210 and the islands 250 are formed by patterning the photosensitive material and etching the anodic aluminum oxide mold 200 in the regions from which the photosensitive material has been patterned and removed, the dimension and shape of the openings 210 and the islands 250 are not limited. Each of the openings 210 will later become a body 81 of the probe pin 80. Since the openings 210 and the islands 250 are formed by etching of the anodic aluminum oxide film as described above, the body 81 may have a width in the range of from 1 μm to 100 μm, the void 85 may have a width in the range of from 1 μm to 100 μm, and the probe pin 80 may have a total length in the range of from 1 mm to 10 mm.

An opening formed by laser or drilling machining typically has a circular cross-section or is formed in a shape that does not include a corner where two surfaces meet. In addition, laser or drilling machining has a difficulty in forming a fine hole. Also, these fine holes have to be formed with a pitch interval P in consideration of a mechanical error, and thus are limited in dimension and shape. However, according to the exemplary embodiment of the present disclosure, each of the openings 210 may have an angled corner, and the openings 210 may be formed without a limitation in shape.

For example, when the anodic aluminum oxide mold 200 is wet-etched with an etchant, openings 210 each having vertical sidewalls are formed. Therefore, the body 81 of each probe pin 80 has a quadrangular shape in vertical cross-section.

When a photoresist mold is used instead of the anodic aluminum oxide mold 200, the photoresist mold needs to have a thickness in the range of from 50 μm to 100 μm, and openings need to be formed in a thick photoresist through an exposure process. Therefore, there is a disadvantage in that it is difficult to precisely and quickly form openings each having vertical sidewalls. On the other hand, when the anodic aluminum oxide mold 200 is used to form the openings 210, even if the anodic aluminum oxide mold 200 has a thickness in the range of from 50 μm to 100 μm, it is possible to precisely and quickly form the openings 210 each having vertical sidewalls.

Figure 3B:
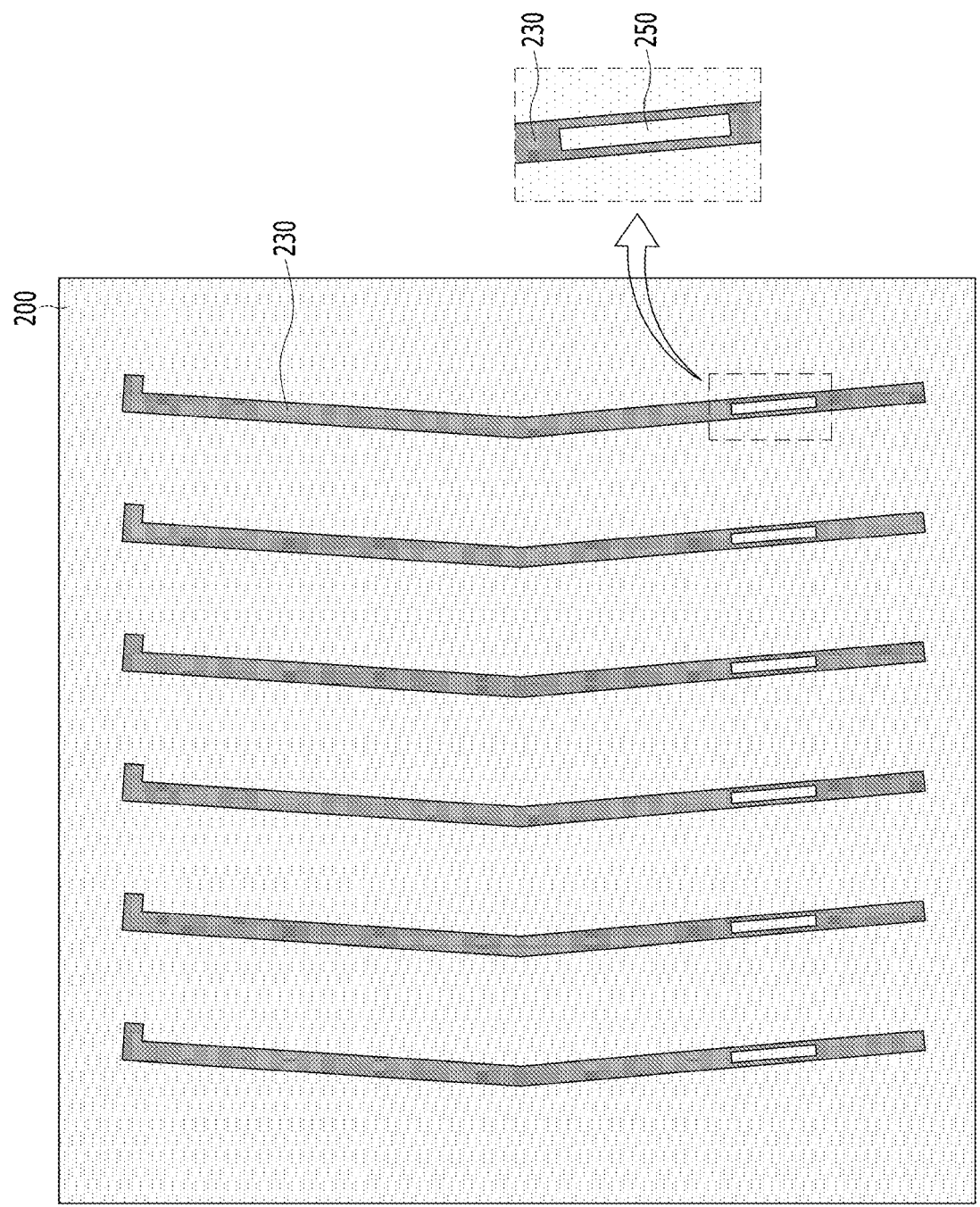
FIG. 3B is a plan view illustrating the anodic aluminum oxide mold according to the exemplary embodiment of the present disclosure in which metal fillers are formed in the openings.

Referring to FIG. 3B, the metal filler 230 may be formed in each of the openings 210 of the anodic aluminum oxide mold 200. As the metal filler 230 is charged in each of the openings 210, each of the islands 250 is surrounded by the metal filler 230.

Figure 3C:
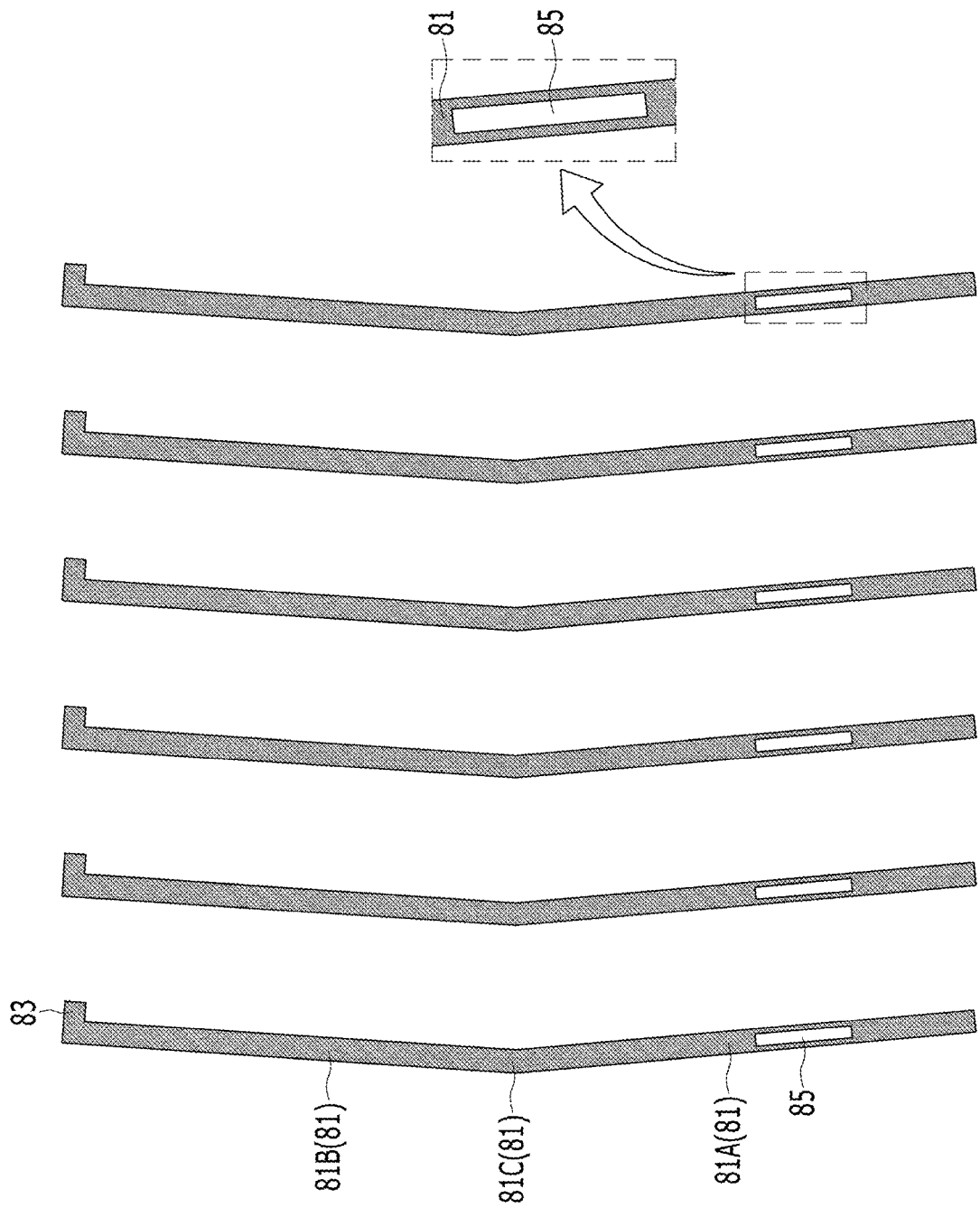
FIG. 3C is a front view illustrating probe pins resulting from removing the anodic aluminum oxide mold illustrated in FIG. 3B.

Referring to FIG. 3C, molded articles are obtained by removing the anodic aluminum oxide mold 200. Here, the molded articles may be probe pins 80. Since the islands 250 are also removed when the anodic aluminum oxide mold 200 is removed, each of the probe pins 80 has a void 85. The removal of the anodic aluminum oxide mold 200 including the islands 250 may be performed through wet etching using an etchant.

Hereinafter, a mold structure 500 according to an exemplary embodiment of the present disclosure capable of manufacturing a molded article, for example, a probe pin 80, and a method of manufacturing the molded article using the mold structure 500 will be described.

The mold structure 500 includes an anodic aluminum oxide mold 200 made of an anodic aluminum oxide film and provided with openings 210, and support members 400, 410, and 600 provided under the anodic aluminum oxide mold 200. The mold structure 500 further includes metal layers 300, 310, and 330 between the anodic aluminum oxide mold 200 and the support members 400, 410, and 600. The metal layers 300, 310, and 330 may be exposed through the openings 210. The metal layers 300, 310, and 330 may serve as a plating seed layer for a metal filler 230 formed in each of the openings 210.

The method of manufacturing the molded article using the mold structure 500 includes: providing an anodic aluminum oxide mold 200 made of an anodic aluminum oxide film and provided with openings 210; forming a metal filler 230 in each of the openings 210; and removing the anodic aluminum oxide mold 200. Here, the step of forming the openings 210 includes performing plating while metal layers 300, 310, and 330 provided under the anodic aluminum oxide mold 200 and exposed through the openings 210 serve as seed layers.

Hereinafter, the mold structure 500 according to the exemplary embodiment of the present disclosure capable of manufacturing the molded article, for example, the probe pin 80, and the method of manufacturing the molded article using the mold structure 500 will be described with reference to FIGS. 4A to 7B.

Figure 4B:
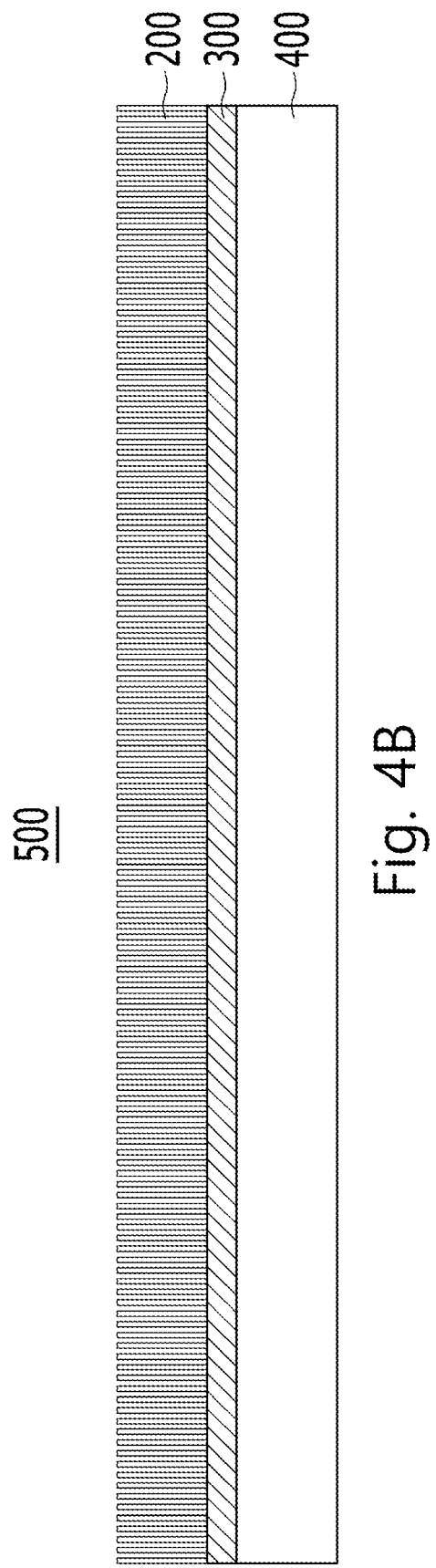
FIG. 4B is a sectional view taken along line A-A' of FIG. 4A.

Referring to FIGS. 4A and 4B, FIG. 4A is a plan view illustrating the mold structure 500 before the openings 210 are formed, and FIG. 4B is a sectional view taken along line A-A' of FIG. 4A. The mold structure 500 includes the anodic aluminum oxide mold 200 made of the anodic aluminum oxide film and the support member 400, provided under the anodic aluminum oxide mold 200. In addition, the mold structure 500 includes the metal layer 300 provided between the anodic aluminum oxide mold 200 and the support member 400.

The support member 400 is a configuration employed to support the anodic aluminum oxide mold 200 to maintain flatness, and may be made of glass, silicon, ceramic, glass-ceramic, or metal. However, the material of the support member 400 is limited thereto, and may be any material as long as it can maintain flatness while supporting the anodic aluminum oxide mold 200.

The metal layer 300 is provided on the support member 400. The metal layer 300 may be made of a material capable of anodization or electroplating. The metal layer 300 may be made of a single metal or an alloy, for example, a single metal selected from the group consisting of copper (Cu), aluminum (Al), magnesium (Mg), titanium (Ti), zinc (Zn), niobium (Nb), and tantalum (Ta), or an alloy of at least one of these metals.

A seed layer (not illustrated) may be provided under the metal layer 300. The seed layer (not illustrated) may be made of titanium or chromium and may be formed by sputtering or the like. As an embodiment, the metal layer 300 may be formed by forming a chromium sputter film to a thickness of 50 nm, and then laminating a copper sputter film to a thickness of 100 nm on the chromium sputter film.

The anodic aluminum oxide mold 200 is provided on the metal layer 300. The anodic aluminum oxide mold 200 is formed by anodizing a metal base material. Here, the metal base material may be the metal layer 300. In other words, when the metal layer 300 is anodized, the anodic aluminum oxide mold 200 made of the anodic aluminum oxide film is formed on the metal layer 300. The anodic aluminum oxide mold 200 may have a thickness in the range of from 50 μm to 100 μm.

On the other hand, the anodic aluminum oxide mold 200 may be separately manufactured from the metal layer 300 through a separate manufacturing process and then provided on the metal layer 300. In the separate manufacturing process, the anodic aluminum oxide mold 200 may be manufactured by anodizing a metal base material to form an anodic aluminum oxide film, followed by removing the metal base material. The anodic aluminum oxide mold 200 thus manufactured may be provided on the metal layer 300. In this case, the metal layer 300 may be made of a material capable of electroplating for a subsequent process.

Figure 5A:
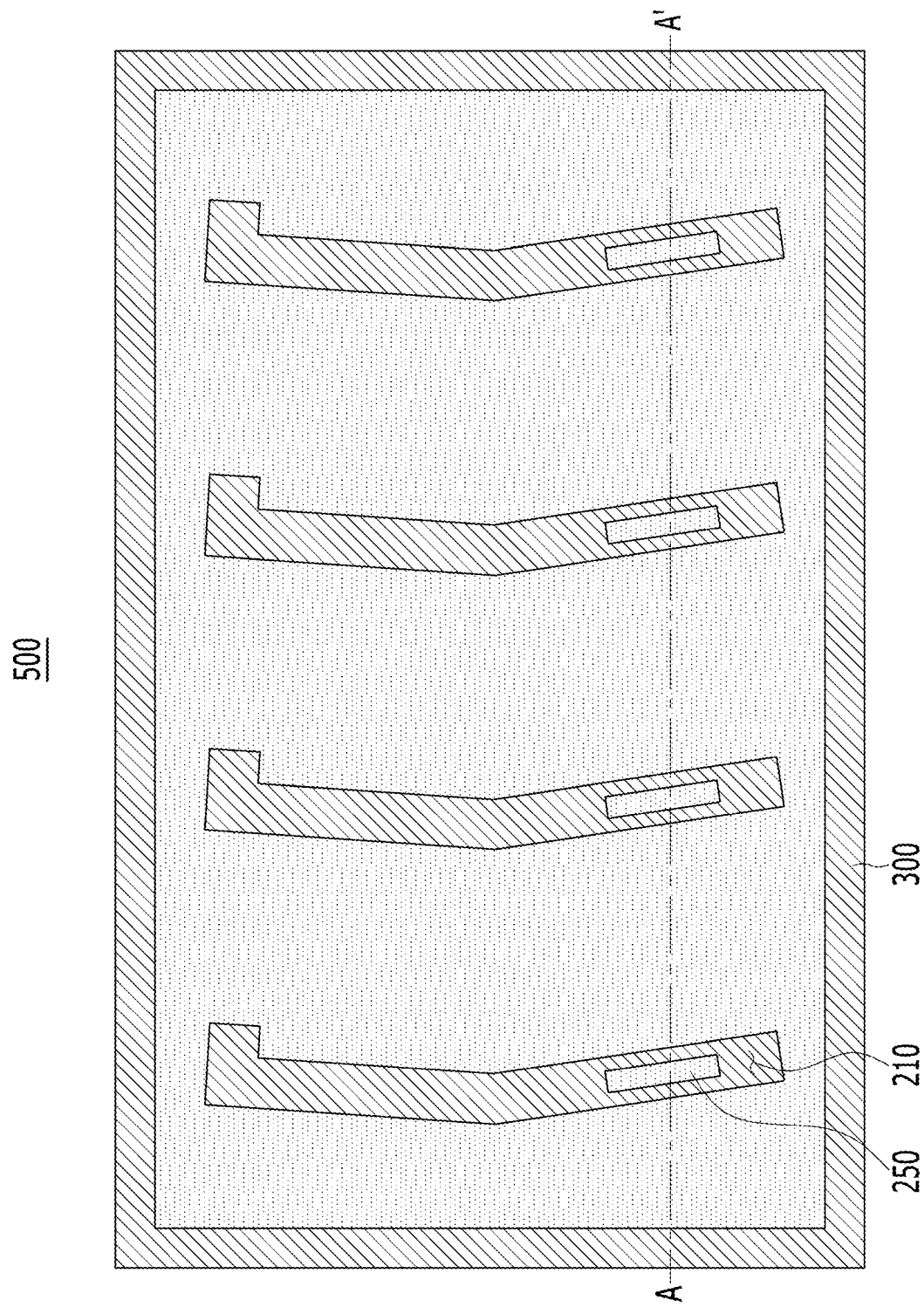
FIG. 5A is a plan view illustrating a mold structure with openings according to an exemplary embodiment of the present disclosure.
Figure 5B:
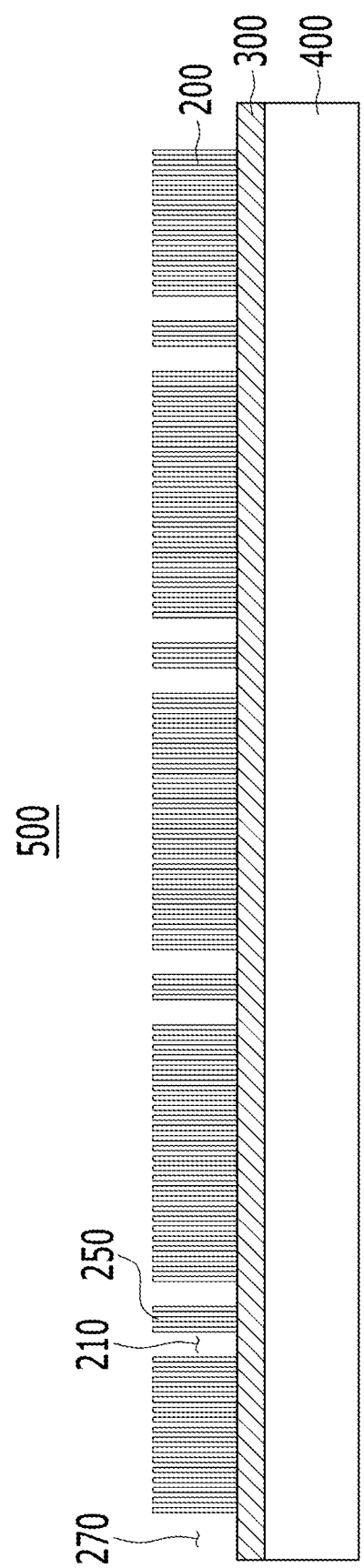
FIG. 5B is a sectional view taken along line A-A' of FIG. 5A.

Referring to FIGS. 5A and 5B, FIG. 5A is a plan view illustrating the mold structure 500 after the openings 210 are formed, and FIG. 5B is a sectional view taken along line A-A' of FIG. 5A.

After a photosensitive material is provided on an upper surface of the anodic aluminum oxide mold 200 illustrated in FIGS. 4A and 4B, a photoresist process may be performed. At least portions of the photosensitive material may be patterned and removed through the photoresist process. The anodic aluminum oxide mold 200 may be formed by etching regions from which the photosensitive material has been patterned and removed. Through such a process, the anodic aluminum oxide mold 200 with the openings 210 as illustrated in FIGS. 5A and 5B is obtained. The shape of the openings 210 is the same as that of probe pins 80 to be manufactured.

The openings 210 are formed by etching the anodic aluminum oxide mold 200. For example, a photoresist may be provided on the upper surface of the anodic aluminum oxide mold 200 and patterned. Then, in patterned and opened regions, the anodic aluminum oxide film may react with the etchant to form the openings 210. Specifically, a photosensitive material may be provided on the upper surface of the anodic aluminum oxide mold 200 before the openings 210 are formed, followed by undergoing an exposure process. At least portions of the photosensitive material may be patterned and removed through the exposure process. Here, the photosensitive material is not removed but remains on portions of the anodic aluminum oxide mold 200 that will later become islands 250. The anodic aluminum oxide mold 200 is etched in open regions from which the photosensitive material has been patterned and removed. The anodic aluminum oxide film is removed by the etchant in the open regions except for regions that will later become the islands 250, resulting in the openings 210.

Although only four openings 210 are illustrated in FIGS. 5A and 5B, tens of thousands to hundreds of thousands of openings 210 may be formed through one-time etching process. This is therefore more efficient than laser or drilling machining. In addition, when a silicon wafer is used as a mold, it is difficult to form openings 210 each having vertical side walls. Also, when a deep reactive-ion etching (DRIE) process is used, this process is costly. However, the process of etching the anodic aluminum oxide film to form the openings 210 is effective in forming vertical sidewalls at a low cost.

During the etching process, at least a portion of the anodic aluminum oxide mold 200 may be removed to form a free space 270. The free space 270 is located preferably on the outside of the mold structure 500, and more preferably on the outer edge of the mold structure 500. The free space 270 allows an upper surface of the metal layer 300 to be exposed there through. The free space 270 becomes a connection region of a plating electrode in a subsequent electroplating process.

An island 250 made of an anodic aluminum oxide film is provided inside each of the openings 210. The island 250 is a region defined by a remaining portion of the anodic aluminum oxide mold 200 remaining without being removed when each of the openings 210 is formed by etching a portion of the anodic aluminum oxide mold 200. The island 250 becomes a void 85 of a final molded article. The configuration of the void 85 formed in the final molded article may be the same as that of the island 250. The configuration of an opening 210 will be described with reference to FIGS. 10A to 12D. Referring to FIGS. 10A to 10D, the island 250 may be formed in a second opening 210B. As another embodiment, the island 250 may be formed in each of a first opening 210A and the second opening 210B. As another embodiment, the island 250 may be formed at the intersection of the first opening 210A and the second opening 210B, and the island 250 may be continuously formed in the first opening 210A and the second opening 210B. On the other hand, referring to FIGS. 11A to 11D, a plurality of islands 250 may be provided in the opening 210 in the width direction thereof. As an embodiment, two islands 250 may be formed in a parallel arrangement in each of the first opening 210A and the second opening 210B. As another embodiment, a plurality of islands 250 may be provided in the opening 200 such that projection areas between at least two islands 250 overlap each other. As another embodiment, a plurality of islands 250 may have different lengths, and at least one of the islands 250 may be continuously formed in the first opening 210A and the second opening 210B. As another embodiment, the number of islands 250 formed in the first opening 210A may be different from that formed in the second opening 210B, and the islands 250 formed in the first opening 210A and those formed in the second opening 210B may have different widths. Referring to FIGS. 12A to 12D, the island 250 may have a round shape. As an embodiment, the island 250 may have a round shape and may be provided in the first opening 210A or the second opening 210B. As another embodiment, the island 250 may have a round shape that is continuously formed in the first opening 210A and the second opening 210B. As another embodiment, the island 250 may have a circular shape, and a plurality of islands 250 having a circular shape may be provided in the first opening 210A and/or the second opening 210B. As another embodiment, the island 250 may have a sine wave shape or a 'W' shape.

Figure 6A:
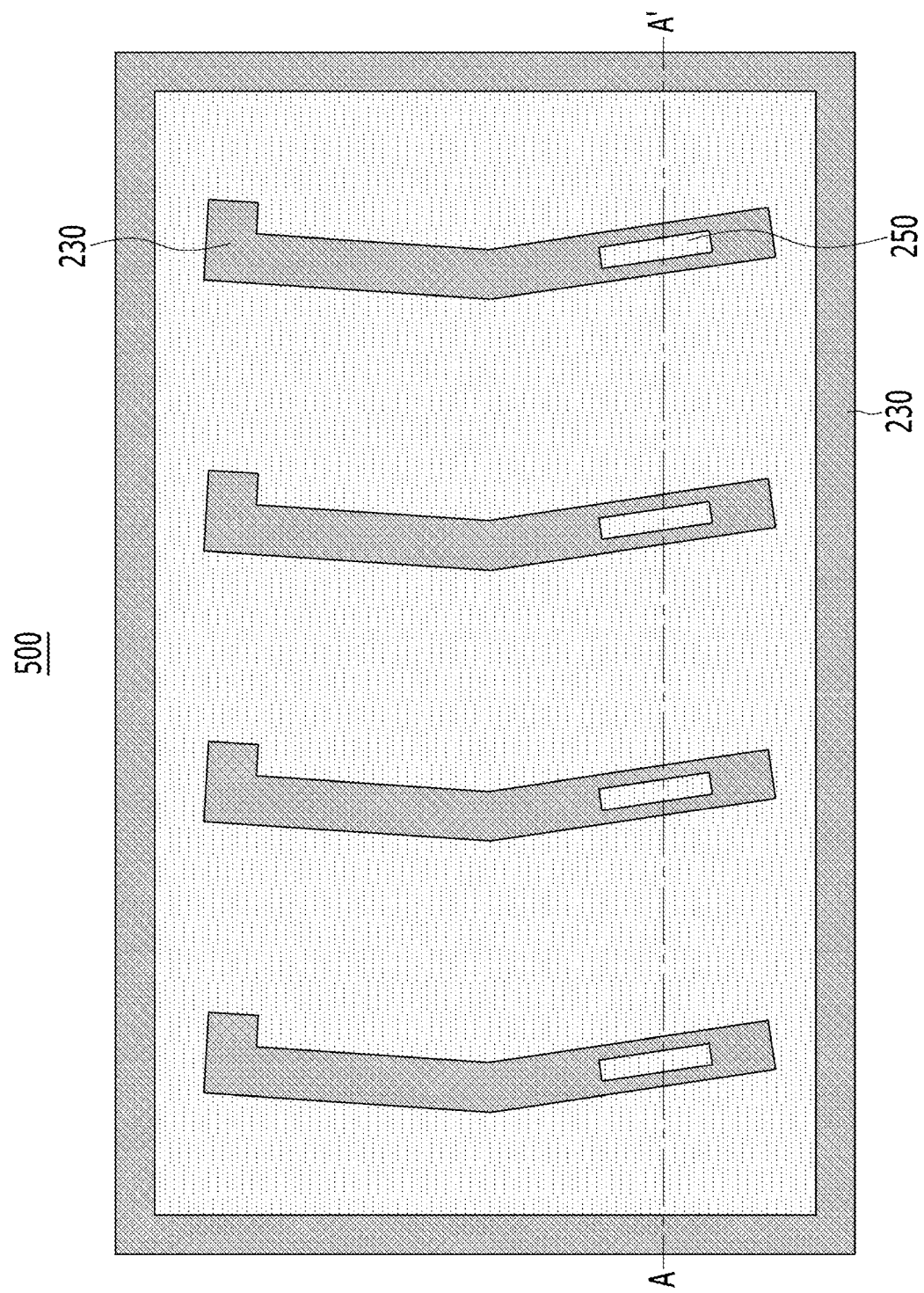
FIG. 6A is a plan view illustrating the mold structure according to the exemplary embodiment of the present disclosure in which metal fillers are formed in the openings.
Figure 6B:
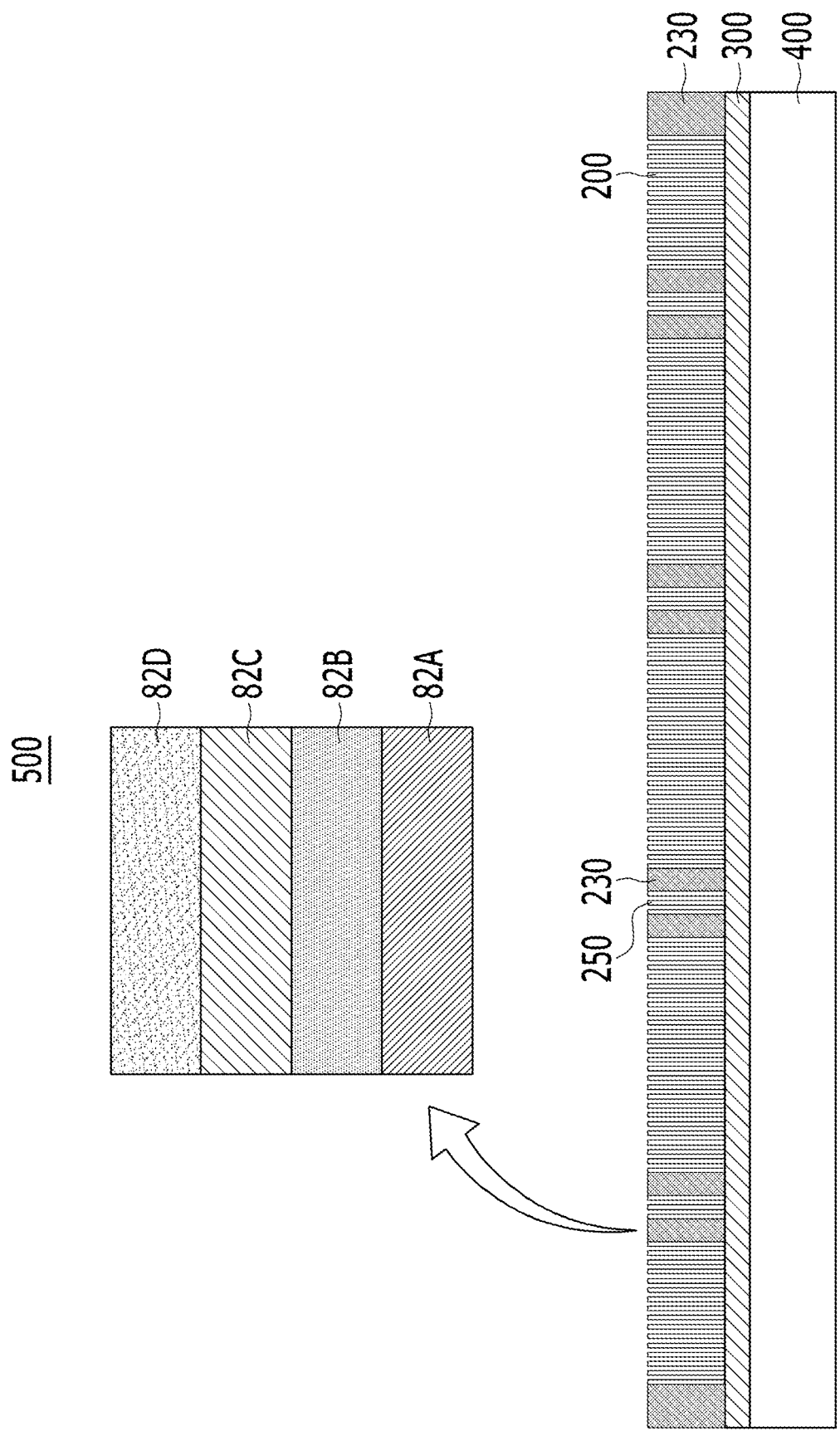
FIG. 6B is a sectional view taken along line A-A' of FIG. 6A.

Referring to FIGS. 6A and 6B, FIG. 6A is a plan view illustrating the mold structure 500 in which metal fillers 230 are formed in the openings 210, and FIG. 6B is a sectional view taken along line A-A' of FIG. 6A.

Electroplating may be performed by connecting a plating electrode to the upper surface of the metal layer 300 exposed through the free space 270. As a result of electroplating, the metal fillers 230 are formed on the metal layer 300 in the openings 210 while the metal layer 300 serves as a feeding layer. According to the exemplary embodiment of the present disclosure, a sliding phenomenon of the anodic aluminum oxide mold 200 due to plating is prevented, thereby implementing a uniform shape.

Each of the metal fillers 230 formed through electroplating may be at least one selected from the group consisting of platinum (Pt), rhodium (Ph), palladium (Pd), copper (Cu), silver (Ag), gold (Au), iridium (Ir), an alloy thereof, a nickel-cobalt (NiCo) alloy, a palladium-cobalt (PdCo) alloy, a palladium-nickel (PdNi) alloy, and a nickel-phosphorus (NiP) alloy.

Each of the metal fillers 230 may have a multi-layer structure in which a plurality of layers of conductive materials are stacked. Each of the layers of the metal filler 230 may be made of a different material. The material thereof may be selected from the group consisting of platinum (Pt), rhodium (Ph), palladium (Pd), copper (Cu), silver (Ag), gold (Au), iridium (Ir), an alloy thereof, a palladium-cobalt (PdCo) alloy, a palladium-nickel (PdNi) alloy, and a nickel-phosphorus (NiP) alloy.

Each of the metal fillers 230 may have a multi-layer structure in which first to fourth conductive layers are stacked. The metal filler 230 may be formed by sequentially plating the first to fourth conductive layers. As such, different conductive materials may be sequentially plated without causing the modification of the anodic aluminum oxide mold 200. As an embodiment, the first conductive layer 82A may be made of platinum (Pt), the second conductive layer 82B may be made of rhodium (Ph), the third conductive layer 82C may be made of palladium (Pd), and the fourth conductive layer 82D may be made of a nickel-cobalt (NiCo) alloy.

After the plating process is completed, a planarization process may be performed. A portion of each of the metal fillers 230 protruding from the upper surface of the anodic aluminum oxide mold 200 is removed through a chemical mechanical polishing (CMP) process. In consideration of the design thickness of the probe pin 80, portions of the upper surface of the anodic aluminum oxide mold 200 including the metal fillers 230 may be removed.

Figure 7A:
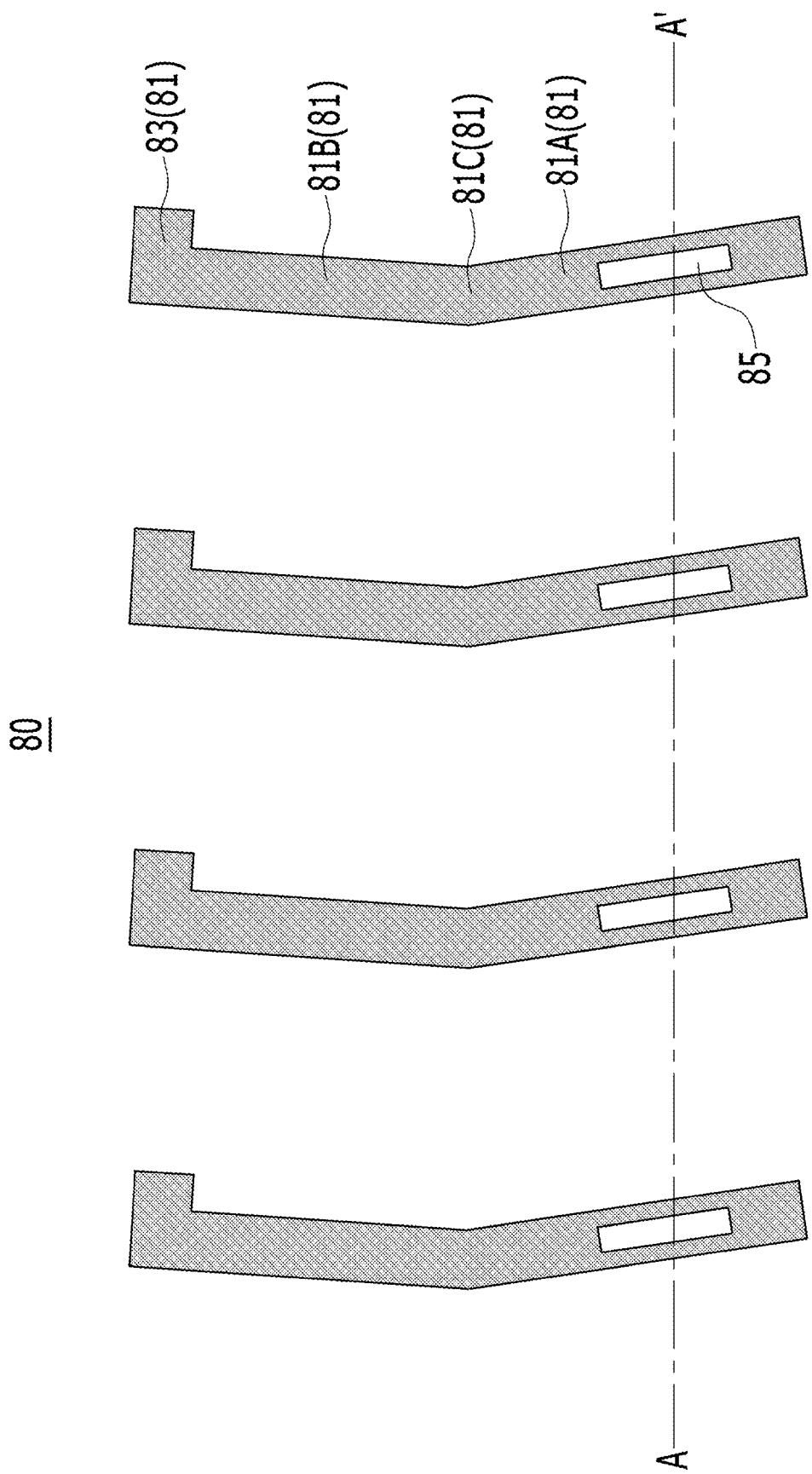
FIG. 7A is a front view illustrating probe pins resulting from removing the mold structure.

Referring to FIGS. 7A and 7B, FIG. 7A is a plan view illustrating molded articles resulting from removing the mold structure 500, and FIG. 7B is a sectional view taken along line A-A' of FIG. 7A. After the planarization process is completed, the anodic aluminum oxide mold 200 made of the anodic aluminum oxide film is removed using an etchant. As the anodic aluminum oxide mold 200 is removed, the islands 250 are also removed by the etchant. As a result, voids 85 are formed in the places where the islands 250 have been removed.

Then, the metal layer 300 is removed using an etchant dedicated to the metal layer 300 to separate the molded articles and the support member 400. As an embodiment, the molded articles may be probe pins 80. Thereafter, a body 81 of each of the probe pins 80 may be further provided with an outer coating layer 82E. The outer coating layer 82E may be made of a material having a hardness higher than that of the conductive materials located inside thereof.

Hereinafter, a mold structure 500 according to an exemplary embodiment of the present disclosure capable of manufacturing a molded article, for example, a probe pin 80, and a method of manufacturing the molded article using the mold structure 500 will be described with reference to FIGS. 8A to 8E.

As illustrated in FIGS. 8A to 8E, a support member 400 provided under an anodic aluminum oxide mold 200 includes a first support member 600 provided under the anodic aluminum oxide mold 200 in an electroplating process to support the anodic aluminum oxide mold 200; and a second support member 410 provided under the anodic aluminum oxide mold 200 in a planarization process to support the anodic aluminum oxide mold 200.

Referring to FIG. 8A, metal layers 310 and 330 are provided on the first support member 600. The metal layers 310 and 330 include a first metal layer 310 provided under the anodic aluminum oxide mold 200 and a second metal layer 330 provided on an upper surface of the first support member 600. The first metal layer 310 made of a metal material is provided under the anodic aluminum oxide mold 200. More preferably, the first metal layer 310 made of a metal material is provided on a surface of a barrier layer formed during the manufacture of the anodic aluminum oxide mold 200. The first metal layer 310 is preferably made of copper (Cu) or platinum (Pt), but is not limited thereto as long as it is a material capable of electroplating. The second metal layer 330 is provided on an upper surface of a concave portion of the first support member 600 and is preferably made of, but is not limited to, copper (Cu) effective for electroplating. The first metal layer 310 provided on the anodic aluminum oxide mold 200 may be provided before the anodic aluminum oxide mold 200 is mounted on the first support member 600. Also, the second metal layer 330 provided on the first support member 600 may be provided before the anodic aluminum oxide mold 200 is mounted on the first support member 600. A preparatory step for electroplating is completed by providing the anodic aluminum oxide mold 200 provided with the first metal layer 310 on an upper surface of the second metal layer 330 provided on the first support member 600, and then fixing the anodic aluminum oxide mold 200 to the first support member 600. A portion of an upper surface of the anodic aluminum oxide mold 200 is clamped by a clamping part provided at an upper portion of the first support member 600, so that the anodic aluminum oxide mold 200 is fixed in place without moving.

The anodic aluminum oxide mold 200 is made of an anodic aluminum oxide film and is provided with openings 210. The anodic aluminum oxide mold 200 is formed by anodizing a metal base material. An island 250 made of an anodic aluminum oxide film is provided inside each of the openings 210. The island 250 is a region defined by a remaining portion of the anodic aluminum oxide mold 200 remaining without being removed when each of the openings 210 is formed by etching a portion of the anodic aluminum oxide mold 200, and is an anodic aluminum oxide film region surrounded by the opening 210. The anodic aluminum oxide mold 200 may have a thickness in the range of from 50 μm to 100 μm.

Next, as illustrated in FIG. 8B, electroplating is performed using the metal layers 310 and 330. A metal filler 230 is charged in each of the openings 210 of the anodic aluminum oxide mold 200, except for the respective islands 250, in a direction from a lower portion of the opening 210 to an upper portion thereof.

After the electroplating is completed, as illustrated in FIG. 8C, the anodic aluminum oxide mold 200 is separated from the first support member 600 and then provided on an upper surface of the second support member 410, followed by undergoing a planarization process. In this case, when the anodic aluminum oxide mold 200 is separated from the first support member 600, the first metal layer 310 under the anodic aluminum oxide mold 200 is also separated from the first support member 600. A bonding layer 370 is provided on the upper surface of the second support member 410. The bonding layer 370 allows the anodic aluminum oxide mold 200 to be fixed to the second support member 410 without moving. Then, a portion of each of the respective metal fillers 230 protruding from the upper surface of the anodic aluminum oxide mold 200 is removed through a chemical mechanical polishing (CMP) process. In consideration of the design thickness of the probe pin 80, portions of the upper surface of the anodic aluminum oxide mold 200 including the metal fillers 230 may be removed.

Next, as illustrated in FIG. 8D, only the anodic aluminum oxide mold 200 is removed using an etchant that does not react with the first metal layer 310 and the bonding layer 370 but selectively reacts only with the anodic aluminum oxide mold 200. In this case, the islands 250 are also removed by the etchant.

Next, as illustrated in FIG. 8E, the first metal layer 310 is removed using an etchant that selectively reacts with the first metal layer 310, thereby completing the manufacture of molded articles. Each of the molded articles (probe pins) thus manufactured includes a body 81 and a void 85 formed in the body 81.

Figure 9A:
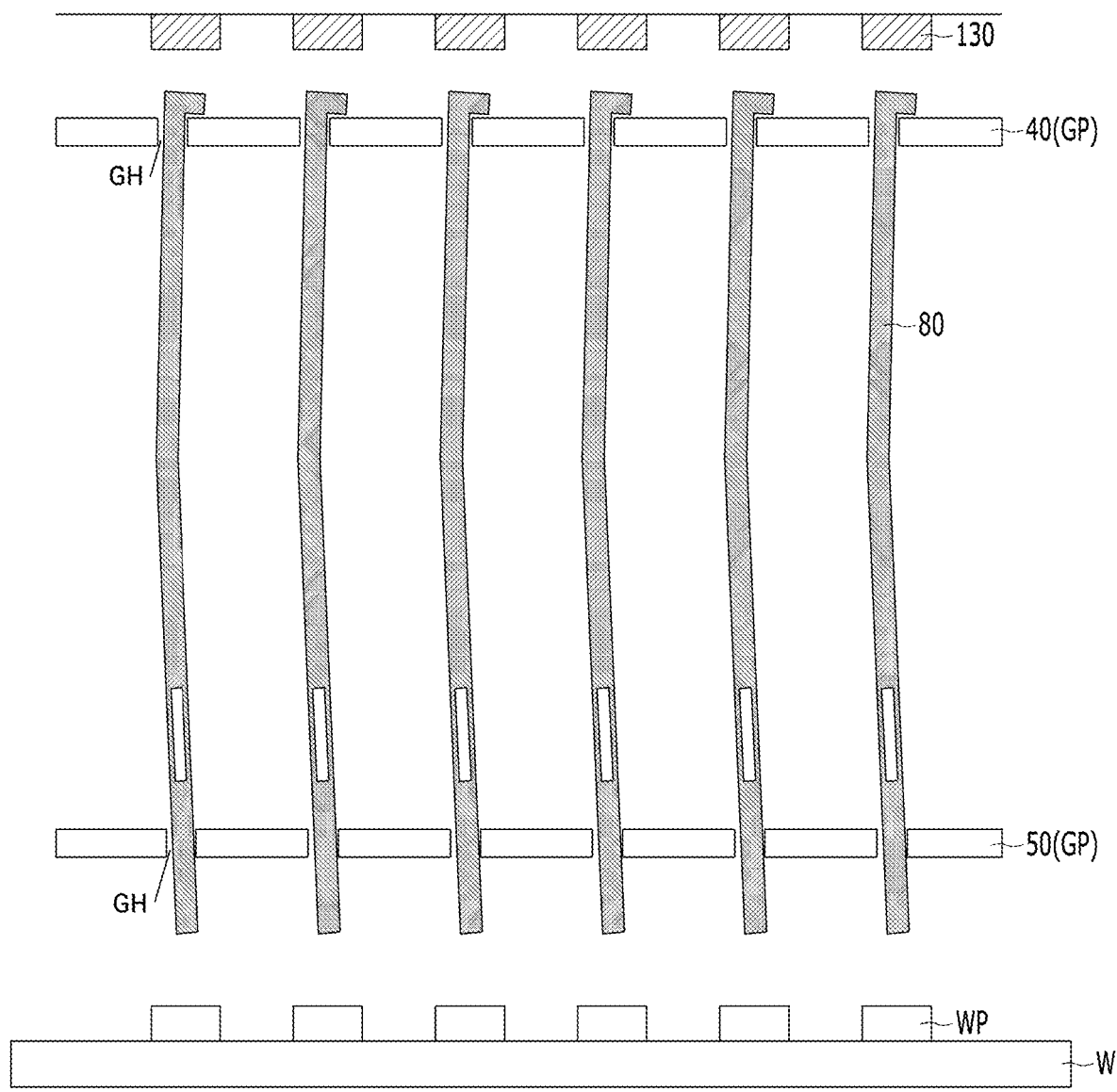
FIG. 9A is a view showing a probe head having probe pins according to the exemplary embodiment of the present disclosure before contact with contact with a semiconductor wafer.
Figure 9B:
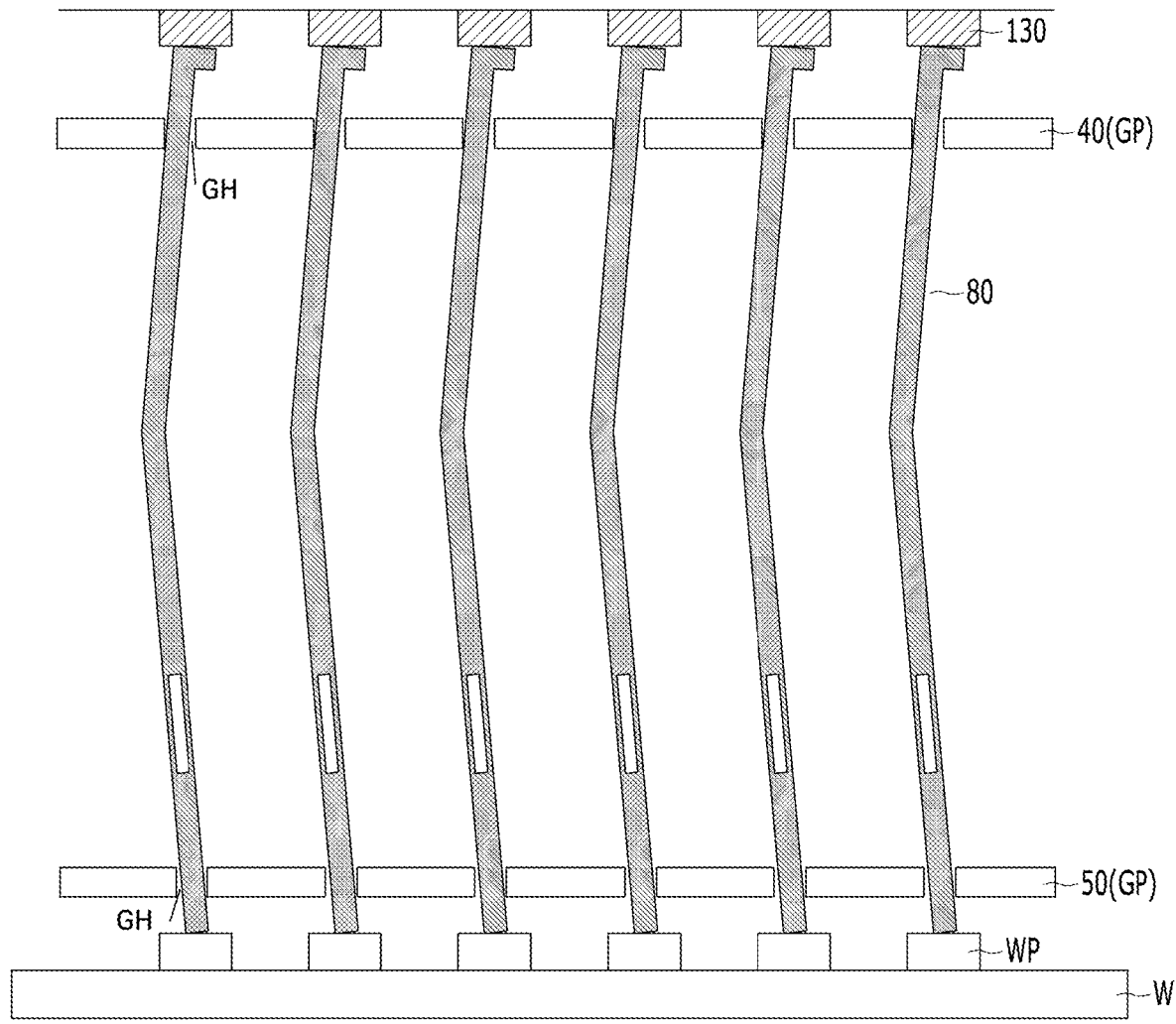
FIG. 9B is a view showing the probe head having probe pins according to the exemplary embodiment of the present disclosure after contact with contact with the semiconductor wafer.
Figure 11A:
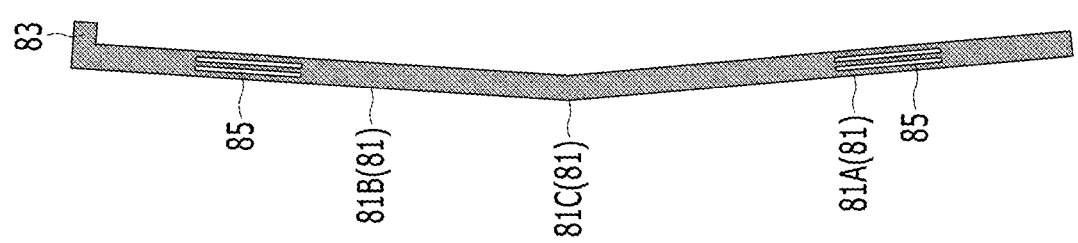
Figure 11B:
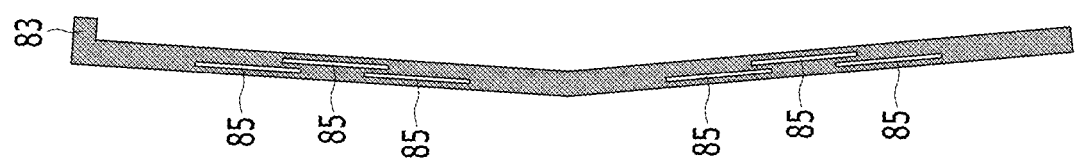
Figure 11C:
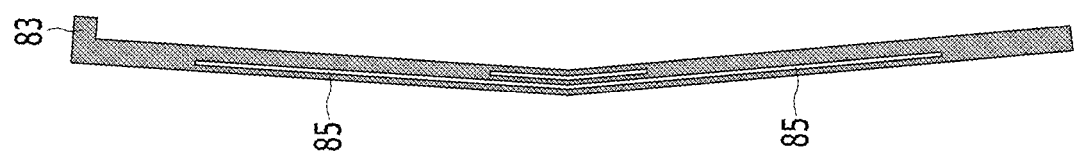
Figure 11D:
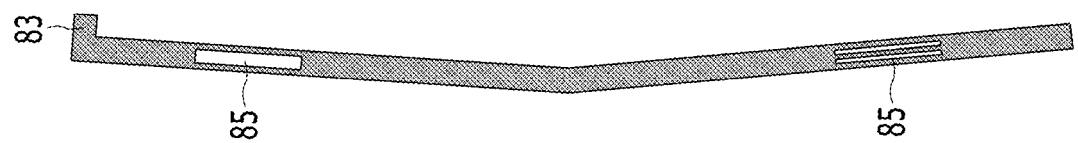
Figure 12A:
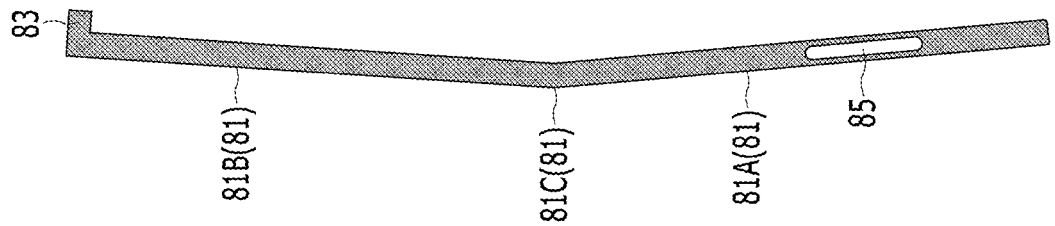
Figure 12B:
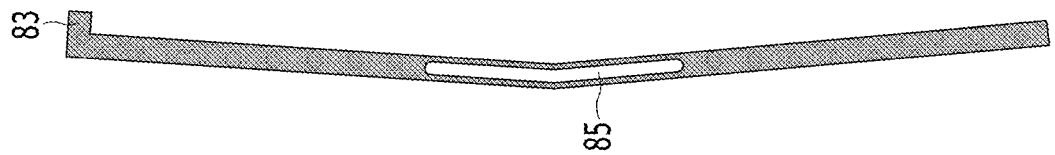
Figure 12C:
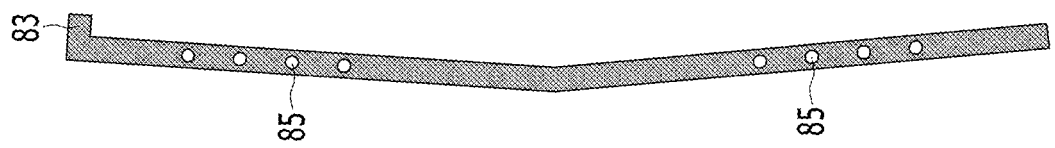
Figure 12D:
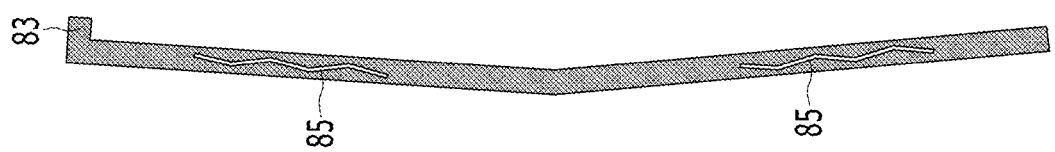

FIGS. 9A and 9B are views illustrating a probe head 1 in which a plurality of probe pins 80 manufactured according to the exemplary embodiment of the present disclosure are inserted into a plurality of guide holes GH of each of an upper guide plate 40 and a lower guide plate 50.

Referring to FIG. 9A, each of the probe pins 80 includes the body 81 and the void 85 formed in the body 81. The width of the void 85 may be in the range of from 1 μm to 100 μm. The body 81 includes a first body 81A inserted into the lower guide plate 50 and a second 81B inserted into the upper guide plate 40. The first body 81A of the body 81 has a protrusion 83 formed at an end thereof so that the protrusion 83 is caught on an upper surface of the upper guide plate 40, thereby preventing the probe pin 80 from escaping out of a corresponding guide hole GH.

Referring to FIG. 9A, a test for electrical characteristics of semiconductor devices is performed by approaching a semiconductor wafer W to a probe card 100 having the plurality of probe pins 80, thereby bringing the respective probe pins 80 into contact with corresponding electrode pads WP on the semiconductor wafer W. When bringing the probe pins 80 into contact with the corresponding electrode pads WP on the semiconductor wafer W, after the probe pins 80 and the corresponding electrode pads WP reach a state in which they start to make contact with each other, a process of further approaching the semiconductor wafer W to the probe card 100 is performed. Referring to FIG. 9B, overdrive is performed to elastically deform the probe pins. By performing the overdrive, all the probe pins 80 may be reliably brought into contact with the corresponding electrode pads WP even in the case where there are variations in height among the electrode pads WP or the probe pins 80. In addition, during the overdrive, as the probe pins 80 are elastically deformed, probe tips scrub across the electrode pads WP. This scrubbing action causes the tips to remove oxide layers on the surface of the electrode pads WP, which reduces contact resistance.

During the overdrive, the probe pins 80 are elastically deformed. With the configuration in which each of the probe pins 80 has the void 85, it is possible to ensure a desired overdrive amount, and to shorten the length of the probe pins 80 while ensuring desired probe pressure and permissible time-current characteristics. The length of the probe pins 80 may be shortened to equal to or less than 10 mm, which reduces inductance, thereby improving high frequency characteristics.

With reference to FIGS. 10A to 12D, the configuration of various embodiments of a molded article, preferably a probe pin 80, will be described.

Referring to FIGS. 10A to 10D, a void 85 may be formed in a second body 81B (see FIG. 10A). As another embodiment, the void 85 may be formed in each of a first body 81A and the second body 81B (see FIG. 10B). As another embodiment, the void 85 may be formed at an intersection 81C of the first body 81A and the second body 81B (see FIG. 10C), and the void 85 may be continuously formed in the first body 81A and the second body 81B (see FIG. 10D).

Referring to FIGS. 11A to 11D, a plurality of voids 85 may be formed in the body 81 in the width direction thereof. As an embodiment, two voids 85 may be formed in a parallel arrangement in each of the first body 81A and the second body 81B (see FIG. 11A). As another embodiment, a plurality of voids 85 may be formed in the body 81 such that projection areas between at least two voids 85 overlap each other (see FIG. 11B). As another embodiment, a plurality of voids 85 may have different lengths, and at least one of the voids 85 may be continuously formed in the first body 81A and the second body 81B (see FIG. 11C). As another embodiment, the number of voids 85 formed in the first body 81A may be different from that formed in the second body 81B, and the voids 85 formed in the first body 81A and those formed in the second body 81B may have different widths.

Referring to FIGS. 12A to 12D, the void 85 may have a round shape. As an embodiment, the void 85 may have a round shape and may be formed in the first body 81A or the second body 81B (see FIG. 12A). As another embodiment, the void 85 may have a round shape that is continuously formed in the first body 81A and the second body 81B (see FIG. 12B). As another embodiment, the void 85 may have a circular shape, and a plurality of voids 85 having a circular shape may be formed in the first body 81A and/or the second body 81B (see FIG. 12C). As another embodiment, the void 85 may have a sine wave shape or a 'W' shape (see FIG. 12D).

Although the exemplary embodiments of the present disclosure have been described for illustrative purposes, those of ordinary skill in the art will appreciate that various modifications, additions, and substitutions are possible, without departing from the scope and spirit of the disclosure as disclosed in the accompanying claims.

What is claimed is:

1. A method of manufacturing a molded article, the method comprising:
   providing an anodic aluminum oxide mold made of an anodic aluminum oxide film, wherein the anodic aluminum oxide film is made by anodizing a metal base material and removing the metal base material;
   providing a support member configured to support the anodic aluminum oxide mold to maintain flatness;
   providing a metal layer between the anodic aluminum oxide mold and the support member, wherein the metal layer comprises a material capable of electroplating;
   providing a photosensitive material that physically contacts the other surface of the anodic aluminum oxide film;
   forming a plurality of openings in the anodic aluminum oxide film, wherein a shape of the openings is determined according to a shape of patterns resulting from patterning of the photosensitive material provided on the anodic aluminum oxide film
   forming a metal filler in each of the openings; and
   removing the anodic aluminum oxide mold,
   wherein the anodic aluminum oxide mold is separately manufactured from the metal layer by anodizing the metal base material to form the anodic aluminum oxide film and subsequently removing the metal base material.

2. The method of claim 1, wherein the forming of the metal filler in each of the openings comprises performing plating while the metal layer provided under the anodic aluminum oxide mold and exposed through the openings serves as a seed layer.

3. The method of claim 1, wherein the molded article is a probe pin.

4. The method of claim 1, wherein, after the metal base material has been entirely removed, the separately manufactured anodic aluminum oxide mold is provided on the metal layer.

5. A method of manufacturing an anodic aluminum oxide mold, the method comprising:
   providing the anodic aluminum oxide film made by anodizing a metal base material and removing the metal base material;
   providing a support member configured to support the anodic aluminum oxide mold to maintain flatness;
   providing a metal layer between the anodic aluminum oxide mold and the support member, wherein the metal layer comprises a material capable of electroplating;
   providing a photosensitive material that physically contacts a surface of the anodic aluminum oxide film; and
   forming a plurality of openings in the anodic aluminum oxide film,
   wherein a shape of the openings is determined according to a shape of patterns resulting from patterning of the photosensitive material provided on the anodic aluminum oxide film,
   wherein the anodic aluminum oxide mold is separately manufactured from the metal layer by anodizing the metal base material to form the anodic aluminum oxide film and subsequently removing the metal base material.

6. The method of claim 5, wherein the metal layer exposed through the openings serves as a seed layer.

* * * * *